United States Patent
Sakai et al.

(10) Patent No.: US 11,691,887 B2
(45) Date of Patent: Jul. 4, 2023

(54) TUNABLE BLUE EMITTING LEAD HALIDE PEROVSKITES

(71) Applicant: OXFORD UNIVERSITY INNOVATION LIMITED, Oxford (GB)

(72) Inventors: Nobuya Sakai, Oxford (GB); Bernard Wenger, Oxford (GB); Henry James Snaith, Oxford (GB)

(73) Assignee: OXFORD UNIVERSITY INNOVATION LIMITED, Oxford (GB)

( * ) Notice: Subject to any disclaimer, the term of this patent is extended or adjusted under 35 U.S.C. 154(b) by 0 days.

(21) Appl. No.: 17/259,676

(22) PCT Filed: Jul. 12, 2019

(86) PCT No.: PCT/GB2019/051962
§ 371 (c)(1),
(2) Date: Jan. 12, 2021

(87) PCT Pub. No.: WO2020/012194
PCT Pub. Date: Jan. 16, 2020

(65) Prior Publication Data
US 2021/0230011 A1    Jul. 29, 2021

(30) Foreign Application Priority Data
Jul. 13, 2018   (GB) ...................... 1811537

(51) Int. Cl.
*C09K 11/66* (2006.01)
*C01D 17/00* (2006.01)

(52) U.S. Cl.
CPC ............ *C01D 17/00* (2013.01); *C09K 11/665* (2013.01); *C01P 2002/34* (2013.01); *C01P 2006/60* (2013.01)

(58) Field of Classification Search
CPC .................................................. C09K 11/665
See application file for complete search history.

(56) References Cited

U.S. PATENT DOCUMENTS

| 9,880,458 B1 | 1/2018 | Irwin |
| 2017/0321117 A1* | 11/2017 | Weidman ............ C04B 35/5152 |

(Continued)

FOREIGN PATENT DOCUMENTS

| CN | 108276989 A | 7/2018 |
| WO | 2013171518 A1 | 11/2013 |

(Continued)

OTHER PUBLICATIONS

Amgar et al. (2018) Near ultra-violet to mid-visible band gap tuning of mixed cation Rb x Cs 1-x PbX 3 (X=Cl or Br) perovskite nanoparticles. Nanoscale, 10(13), 6060-6068.

(Continued)

*Primary Examiner* — Matthew E. Hoban
(74) *Attorney, Agent, or Firm* — Quarles & Brady LLP

(57) ABSTRACT

The invention relates to perovskite compounds which have surprisingly good emission properties, particularly photoluminescent emission properties, in the blue region of the visible spectrum. These perovskites contain a mixture of cations or a mixture of halides, or both. The invention also relates to a photoactive material containing the perovskite species of the invention; to an optoelectronic device containing the photoactive material of the invention; to a method of producing blue light; and to the use of the photoactive material of the invention to emit blue light or as a phosphor.

23 Claims, 9 Drawing Sheets

(56) References Cited

U.S. PATENT DOCUMENTS

| | | | |
|---|---|---|---|
| 2017/0322323 A1 | 11/2017 | Fischer | |
| 2017/0358757 A1* | 12/2017 | Lee | H01L 51/004 |
| 2017/0369776 A1* | 12/2017 | Luchinger | H01L 33/504 |

FOREIGN PATENT DOCUMENTS

| | | |
|---|---|---|
| WO | 2014045021 A1 | 3/2014 |
| WO | 2015092397 A1 | 6/2015 |
| WO | 2017017441 A1 | 2/2017 |
| WO | 2017037448 A1 | 3/2017 |
| WO | 2017089819 A1 | 6/2017 |
| WO | 2018011597 A1 | 1/2018 |
| WO | 2018051278 A2 | 3/2018 |
| WO | 2018203335 A2 | 11/2018 |

OTHER PUBLICATIONS

Barkhouse et al. (2012) Device characteristics of a 10.1% hydrazine-processed Cu2ZnSn (Se, S) 4 solar cell. Progress in Photovoltaics: Research and Applications, 20(1), 6-11.

Bezinge et al. (2018) Pick a color Maria: adaptive sampling enables the rapid identification of complex perovskite nanocrystal compositions with defined emission characteristics. ACS applied materials & interfaces, 10(22), 18869-18878.

Bryant et al. (2016) Light and oxygen induced degradation limits the operational stability of methylammonium lead triiodide perovskite solar cells. Energy & Environmental Science, 9(5), 1655-1660.

Filip et al. (2014) Steric engineering of metal-halide perovskites with tunable optical band gaps. Nature communications, 5(1), 1-9.

Hirade et al. (2011) Small molecular organic photovoltaic cells with exciton blocking layer at anode interface for improved device performance. Applied Physics Letters, 99(15), 153302.

Li et al. (2017) Highly efficient perovskite nanocrystal light-emitting diodes enabled by a universal crosslinking method. Advanced materials, 28(18), 3528-3534.

Linaburg et al. (2017) Cs1-x Rb x PbCl3 and Cs1-x Rb x PbBr3 Solid Solutions: Understanding Octahedral Tilting in Lead Halide Perovskites. Chemistry of Materials, 29(8), 3507-3514.

Louidice et al. (2017) CsPbBr3 QD/AlOx inorganic nanocomposites with exceptional stability in water, light, and heat. Angewandte Chemie 129, 10836.

Nedelcu et al. (2015) Fast anion-exchange in highly luminescent nanocrystals of cesium lead halide perovskites (CsPbX3, X=Cl, Br, I). Nano letters, 15(8), 5635-5640.

Peumans et al. (2001) Small molecular weight organic thin-film photodetectors and solar cells. Journal of Applied Physics, 93(7), 3693-3723.

Protesescu et al. (2015) Nanocrystals of cesium lead halide perovskites (CsPbX3, X=Cl, Br, and I): novel optoelectronic materials showing bright emission with wide color gamut. Nano letters, 15(6), 3692-3696.

Rouquerol et al. (1994) Recommendations for the characterization of porous solids (Technical Report). Pure and applied chemistry, 66(8), 1739.

Sadhanala et al. (2015) Blue-green color tunable solution processable organolead chloride-bromide mixed halide perovskites for optoelectronic applications. Nano letters, 15(9), 6095-6101.

Saliba et al. (2016) Incorporation of rubidium cations into perovskite solar cells improves photovoltaic performance. Science, 354(6309), 206-209.

Stoumpos et al. (2016) Ruddlesden-Popper hybrid lead iodide perovskite 2D homologous semiconductors. Chemistry of Materials, 28(8), 2852-2867.

Sutton et al. (2016) Bandgap-tunable cesium lead halide perovskites with high thermal stability for efficient solar cells. Advanced Energy Materials, 6(8), 1502458.

Tauc et al. (1966) Optical properties and electronic structure of amorphous germanium. physica status solidi (b), 15(2), 627-637.

Wu et al. (2018) Rb+ cations enable the change of luminescence properties in perovskite (Rb x Cs 1-x PbBr 3) quantum dots. Nanoscale, 10(7), 3429-3437.

* cited by examiner

TUNABLE BLUE EMITTING LEAD HALIDE PEROVSKITES

CROSS-REFERENCE TO RELATED APPLICATIONS

This application is a national stage entry of PCT International Application No. PCT/GB2019/051962, filed Jul. 12, 2019, which claims priority to Great Britain Application No. 1811537.8, filed Jul. 13, 2018, both of which are incorporated herein by reference as if set forth in their entirety for all purposes.

The project leading to this application has received funding from the European Union's Horizon 2020 research and innovation programme under the Marie Skłodowska-Curie grant agreement no: 706552.

FIELD OF THE INVENTION

The invention provides a perovskite of formula $[Rb_xCs_{(1-x)}][Pb][Br_yCl_{(1-y)}]_3$, wherein x and y are each greater than 0 and less than 1. The invention also provides a mixed perovskite of formula $\{[A]_2[M][X]_4\}_a\{[Rb_bCs_{(1-b)}][Pb][Br_cCl_{(1-c)}]_3\}_{1-a}$, wherein a is greater than 0 and less than 1, b and c are from 0 to 1, and at least one of b and c is greater than 0 and less than 1. The invention further provides a mixture comprising (a) a compound of formula $[A]_2[M][X]_4$, and (b) a compound of formula $[Rb_bCs_{(1-b)}][Pb][Br_cCl_{(1-c)}]_3$. Also provided are photoactive materials and optoelectronic devices comprising the perovskite, mixed perovskite and mixture of the invention. Also provided is the use of the perovskite, mixed perovskite or mixture in the emission of blue light, and a method of using the perovskite, mixed perovskite or mixture to produce blue light. Also provided is the use of the photoactive material of the invention as a phosphor.

BACKGROUND TO THE INVENTION

There is great demand worldwide for photoactive semiconductor materials which convert electrical energy into light and vice versa. Such materials are useful in a wide range of semiconductor devices, including light-emitting devices. For instance, light-emitting materials are useful in applications such as the production of luminescent screens and light-emitting diodes (LEDs). Light-absorbing materials are in high demand for the production of light-absorbing devices including solar cells.

Organic species are currently widely used in fabricating optoelectronic devices such as LEDs. However, organic species suffer from the disadvantage that they often emit weakly in the blue region of the spectrum. Organic LEDs (OLEDs) typically have a conversion efficiency of up to 20% in the red and green regions of the visible emission spectrum. However, they can often only achieve conversion efficiencies of up to 10% in the blue region of the visible emission spectrum. One key reason for this is that efficient red and green emission in OLEDs relies on the radiative recombination of all single and triplet excitons. Triplet-triplet electron transitions, which are generally spin-forbidden in organic emitters, can be made possible by the introduction of phosphorescent metal complexes. However, suitable metal complexes are often not available or lack stability and efficiency in the blue region of the spectrum.

Inorganic materials such as perovskites do not suffer from the difficulty of spin-forbidden transitions to the same extent. Consequently, there is considerable interest in providing inorganic photoactive materials which can emit strongly in the blue region of the spectrum.

Lead halide perovskites are highly emissive semiconductor materials which have the potential to be useful in such applications. Lead halide perovskites are materials of formula $AMX_3$, wherein M is lead and X is a halide. There is particular interest in lead halide perovskites because, unlike many other semiconductors, it is possible to finely tune their band gap by modifying their composition. For example, the band gap of caesium-based perovskites with a generic composition $CsPb(X_aY_{1-a})_3$, where X and Y are different halides, can be varied over the full visible electromagnetic spectrum by adjusting the halide composition (Li et al, "Highly efficient perovskite nanocrystal light-emitting diodes enabled by a universal crosslinking method", Ad. Mater., 28, 3528-3534, 2017).

Apart from mixing halides, another strategy which has been employed to modify the bandgap of lead halide perovskites is to vary the A cation of a generic $APbX_3$ composition (Linaburg et al, "$Cs_{1-x}Rb_xPbCl_3$ and $Cs_{1-x}Rb_xPbBr_3$ solid solutions: understanding octahedral tilting in lead halide perovskites". Chem. Mater., 29, 3507-3514, 2017). For example, the present inventors have previously investigated the effects of varying the A cation. Application WO2017/089819 describes a crystalline compound comprising (i) $Cs^+$; (ii) formamidinium (FA); (iii) one or more metal or metalloid dications (B); and (iv) two or more different halide anions. This document in particular exemplifies crystalline compounds of formula $FA_xCs_{(1-x)}B(I_{(1-x)}Br_x)_3$. These compounds were shown to have a band gap of approximately 1.75 eV (approximately 700 nm, in the red region of the spectrum).

However, it was found that adding FA cations to a $CsPbX_3$ perovskite caused the band gap to narrow, and hence the emission to move to the red region of the spectrum. This is disadvantageous for attempting to make a blue emitting perovskite. Furthermore, the presence of an organic ammonium ion (particularly FA) in organic-inorganic perovskites results in thermal decomposition of the compounds at relatively low temperatures (below 200° C.). In contrast, inorganic Cs based perovskites, such as $CsPbBr_3$ and $CsPbI_3$, do not suffer from thermal decomposition until temperature is increased to above 350° C. (Sutton et al., *Advanced Energy Materials*, 2016, 6(8)).

The best perovskite solar cells currently available utilise methylammonium ($MA^+$), formamidinium ($FA^+$), cesium ($Cs^+$) and mixtures thereof as the A cation, due to the interesting optoelectronic properties observed for such species.

None of the above strategies has produced an efficient and stable blue emitter. In fact, considerable difficulties have been encountered in lead halide perovskites which emit in the blue region of the visible spectrum.

The photo luminescence quantum efficiency of lead halide perovskites depends strongly on their composition. It has been observed that mixed halide perovskites generally have a lower quantum efficiency than single-halide perovskites such as $CsPbBr_3$ or $CsPbI_3$. The photoluminescence efficiency of perovskites with a generic composition $CsPb(Br_aCl_{1-a})_3$ drops off rapidly with the addition of chloride (i.e. as "a" decreases from 1, see for example Sadhanala et al., *Nano letters*, 2015, 15(9), pp. 6095-6101). Thus, although mixing halides does shift the band gap towards the blue region of the visible spectrum, the efficiency of emission drops too low to provide a useful semiconductor material.

Additionally, lead halide perovskites can suffer from instability (A. Loiudice, S. Saris, E. Oveisi, D. T. L. Alexander, R. Buonsanti, *Angew. Chem. Int. Ed* 2017, 56, 10696, Bryant et al., *Energy Environ. Sci.*, 2016, 9, 1655-1660). They can degrade on exposure to ultraviolet light and to atmospheric species such as water and oxygen. One route of degradation observed where a mixture of ions is used is ion separation, or segregation. This is particularly observed where a mixture of halides is present, as separation can occur into phases with different halide compositions. This route of decay is prominent in known blue-emitting mixed halide perovskites (Li et al., "Highly efficient perovskite nanocrystal light-emitting diodes enabled by a universal crosslinking method", Ad. Mater., 28, 3528-3534, 2017). The chemical and structural stability of the perovskites is also known to vary with the A cation(s) present.

Consequently, a need remains for a stable, efficient blue-emitting inorganic semiconductor material.

SUMMARY OF THE INVENTION

The inventors have now provided stable, tunable, blue-emitting inorganic perovskite materials which are capable of emitting in the blue region of the visible spectrum with a surprisingly high photo luminescence quantum efficiency (PLQE).

In the first instance, the inventors have provided a perovskite of formula (I)

$$[Rb_xCs_{(1-x)}][Pb][Br_yCl_{(1-y)}]_3 \quad (I)$$

wherein x is greater than 0 and less than 1, and y is greater than 0 and less than 1. The mixed bromide and chloride species in the caesium-rubidium mixed cation lead halide perovskite are found to give a product with surprisingly high photoluminescence quantum efficiency (PLQE, also referred to as photoluminescence quantum yield, PLQY) in the blue region of the spectrum. That is, these species emit surprisingly strongly at wavelengths falling within the blue region of the visible spectrum. The blue region is the region from about 450 to about 495 nm. Moreover, the wavelength can be tuned with the composition of the compound of formula (I).

In the second instance, the inventors have provided a mixed perovskite of formula (II)

$$\{[A]_2[M][X]_4\}_a\{[Rb_bCs_{(1-b)}][Pb][Br_cCl_{(1-c)}]_3\}_{1-a} \quad (II)$$

wherein [A] comprises one or more A cations which are organic monocations; [M] comprises one or more M cations which are metal or metalloid dications; [X] comprises one or more X anions which are halide anions; a is greater than 0 and less than 1; b and c are from 0 to 1; and at least one of b and c is greater than 0 and less than 1.

The inventors have also provided a mixture comprising:
(a) a compound of formula $[A]_2[M][X]_4$,
  wherein [A] comprises one or more A cations which are organic monocations; [M] comprises one or more M cations which are metal or metalloid dications; and [X] comprises one or more X anions which are halide anions;
and
(b) a compound of formula $[Rb_bCs_{(1-b)}][Pb][Br_cCl_{(1-c)}]_3$
  wherein b and c are from 0 to 1 and at least one of b and c is greater than 0 and less than 1.

It is surprisingly found that the presence of the $[A]_2[M][X]_4$ species in combination with the mixed halide or mixed cation lead halide perovskite lead to a product with strong blue emission.

However, in a preferred aspect, the mixed perovskite of formula (II) $\{[A]_2[M][X]_4\}_a\{[Rb_bCs_{(1-b)}][Pb][Br_cCl_{(1-c)}]_3\}_{1-a}$ comprises a mixed halide lead perovskite, wherein b and c are both greater than 0 and less than 1 and may, for instance, be from 0.01 to 0.99. This further enhances the PLQE of the compound.

In another preferred aspect, the mixture comprising (a) a compound of formula $[A]_2[M][X]_4$, and (b) a compound of formula $[Rb_bCs_{(1-b)}][Pb][Br_cCl_{(1-c)}]_3$ comprises a mixed halide lead perovskite, wherein b and c are both greater than 0 and less than 1 and may, for instance, be from 0.01 to 0.99. This further enhances the PLQE of the mixture.

The perovskite of formula (I), the mixed perovskite of formula (II) and the mixture described herein show strong and stable emission in the blue region of the visible spectrum. Accordingly, the invention provides the use of the perovskite of formula (I), the mixed perovskite of formula (II) or the mixture comprising (a) a compound of formula $[A]_2[M][X]_4$, and (b) a compound of formula $[Rb_bCs_{(1-b)}][Pb][Br_cCl_{(1-c)}]_3$ in the emission of blue light; preferably in the emission of light having a wavelength of 450-495 nm. In particular, the invention provides such a use wherein the use is to emit blue light having a peak photoluminescence wavelength of from 450 to 495 nm, preferably from 460 to 490 nm.

Similarly, the invention provides a method of producing blue light, the method comprising inducing the perovskite of formula (I), and/or the mixed perovskite of formula (II) and/or the mixture comprising (a) a compound of formula $[A]_2[M][X]_4$, and (b) a compound of formula $[Rb_bCs_{(1-b)}][Pb][Br_cCl_{(1-c)}]_3$, and/or the photoactive material of the invention to emit blue light. In the method, the light emitted typically has a wavelength of 450-495 nm. In particular, the light emitted typically has a peak emission wavelength, for instance a peak photoluminescence wavelength, of from 450 to 495 nm, preferably from 460 to 490 nm.

The advantageous tunable emission properties and stability of the perovskite compounds and mixtures of the invention make them useful as photoactive materials. Such photoactive materials can emit strongly in the blue region of the visible spectrum, and moreover have the advantages of inorganic perovskites such as stability at elevated temperatures. The perovskite compounds and mixtures of the invention are therefore useful in a wide variety of environments. Accordingly, the invention provides a photoactive material comprising a perovskite of formula (I) as defined herein; and/or a mixed perovskite of formula (II) as defined herein; and/or a mixture as defined herein.

In addition to its advantageous physical and optical properties, the photoactive material of the invention can conveniently be formed into a layer, be deposited on a support and otherwise fabricated into a device. Accordingly, the invention further provides an optoelectronic device, preferably a photovoltaic device or light-emitting device, comprising a photoactive material as defined herein.

In view of its capacity to emit surprisingly strongly in the blue region of the spectrum, the photoactive material of the invention can advantageously be used as a phosphor. Accordingly, the invention provides the use of a photoactive material as defined herein as a phosphor, for example as a phosphor which emits light having a wavelength of from 450 to 495 nm. In particular, the light emitted typically has a peak emission wavelength, for instance a peak photoluminescence wavelength, of from 450 to 495 nm, preferably from 460 to 490 nm.

DETAILED DESCRIPTION OF THE INVENTION

Figure 1:
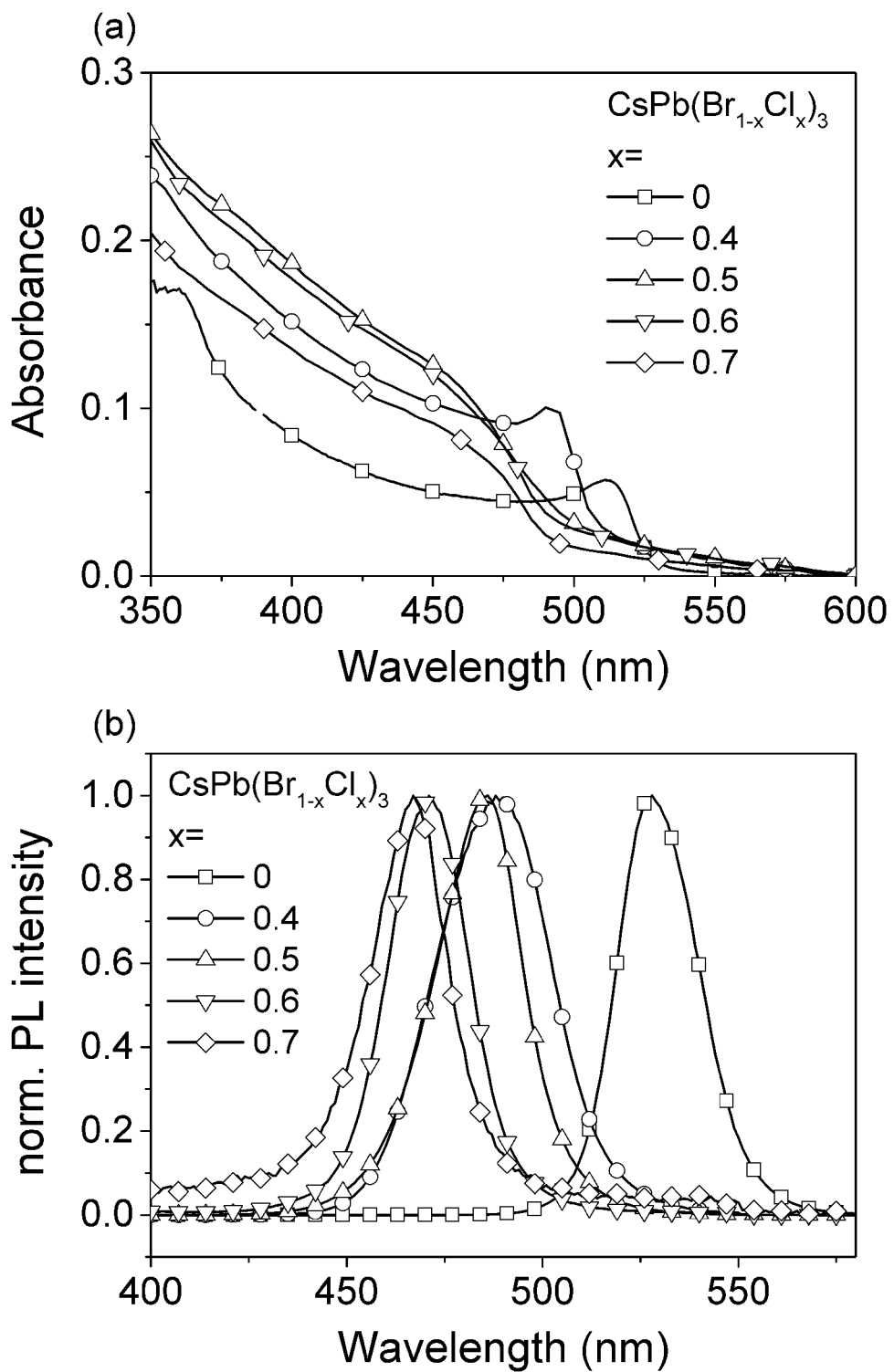
FIG. 1: (a) absorption spectra, and (b) normalised steady-state photoluminescence spectra of $CsPb(Br_{1-x}Cl_x)_3$ thin films.

The invention provides surprisingly strongly blue-emitting perovskite materials. Specifically, the invention provides compounds of formula (I): $[Rb_xCs_{(1-x)}][Pb][Br_yCl_{(1-y)}]_3$; compounds of formula (II): $\{[A]_2[M][X]_4\}_a\{[Rb_bCs_{(1-b)}][Pb][Br_cCl_{(1-c)}]_3\}_{1-a}$; and mixtures comprising (a) a compound of formula $[A]_2[M][X]_4$, and (b) a compound of formula $[Rb_bCs_{(1-b)}][Pb][Br_cCl_{(1-c)}]_3$. The invention further provides photovoltaic materials comprising one or more of the above perovskite materials, and devices comprising such materials.

The compounds of the invention emit in the blue region of the spectrum. Thus, in one embodiment, the compounds of the invention have a peak emission wavelength of 500 nm or less, for example 495 nm or less. In a preferred embodiment, the compounds of the invention have a peak emission wavelength in the range 450 to 500 nm, preferably 455 to 495 nm, particularly preferably 460 to 490 nm.

Aspects of these materials, their uses and their suitable methods of manufacture are discussed in more detail below.

Definitions

By "the compounds of the invention" is meant any or all of compounds of formula (I), compounds of formula (II) and mixtures comprising (a) a compound of formula $[A]_2[M][X]_4$, and (b) a compound of formula $[Rb_bCs_{(1-b)}][Pb][Br_cCl_{(1-c)}]_3$.

The term "perovskite", as used herein, refers to a material with a three-dimensional crystal structure related to that of $CaTiO_3$ or a material comprising a layer or region of material, which layer or region has a structure related to that of $CaTiO_3$. A material with a three-dimensional crystal structure related to that of $CaTiO_3$ may be referred to as having a "3D perovskite structure", and a perovskite according to this definition may therefore be referred to as a "3D perovskite". The structure of $CaTiO_3$ can be represented by the formula $ABX_3$, wherein A and B are cations of different sizes and X is an anion. In the unit cell, the A cations are at (0,0,0), the B cations are at (½, ½, ½) and the X anions are at (½, ½, 0). The A cation is usually larger than the B cation. The skilled person will appreciate that when A, B and X are varied, the different ion sizes may cause the structure of the perovskite material to distort away from the structure adopted by $CaTiO_3$ to a lower-symmetry distorted structure. The symmetry will also be lower if the material comprises a layer that has a structure related to that of $CaTiO_3$. Materials comprising a layer or region of perovskite material are well known. Regarding materials comprising a layer of perovskite material, the structure of materials adopting the $K_2NiF_4$-type structure comprises a layer of perovskite material. Such materials, of general formula $A_2BX_4$, are referred to in the art as "2D layered perovskites", being different in structure from the conventional 3D perovskites. Exemplary 2D layered perovskites include $K_2NiF_4$ and $(butylammonium)_2PbBr_4$.

Thus, the term "perovskite" does not exclusively refer to a bulk $CaTiO_3$-type three-dimensional perovskite structure. A three-dimensional perovskite may be contained within a larger crystalline structure. For instance, the three-dimensional perovskite may be a small region within a larger crystal structure. By way of example, so-called 0D/3D structures. Such structures contain (a) zero-dimensional or "0D" regions, which have a $K_4CdCl_6$-like structure; and (b) regions of a three-dimensional perovskite structure (having a three-dimensional crystal structure related to that of $CaTiO_3$) therein. Such structures are intended to be covered by the claims appended hereto. Thus, for example, the perovskite of the invention may comprise a region which consists of a three-dimensional perovskite, and the three-dimensional perovskite in that region may, for instance, be of formula (I) as defined herein.

The skilled person will appreciate that a 3D perovskite material can be represented by the formula $[A][B][X]_3$, wherein [A] is at least one cation, [B] is at least one cation and [X] is at least one anion. When the perovskite comprises more than one A cation, the different A cations may distributed over the A sites in an ordered or disordered way. When the perovskite comprises more than one B cation, the different B cations may distributed over the B sites in an ordered or disordered way. When the perovskite comprise more than one X anion, the different X anions may distributed over the X sites in an ordered or disordered way. The symmetry of a perovskite comprising more than one A cation, more than one B cation or more than one X cation, will be lower than that of $CaTiO_3$.

The term "mixed perovskite" as used herein refers to a perovskite compound with a certain proportion of a perovskite of formula $[A][B][X]_3$ and a certain proportion of a perovskite of formula $[A]_2[B][X]_4$. A mixed perovskite may therefore comprise two or more layers of a perovskite material that can be represented by the formula $[A][B][X]_3$, and may further comprise at least one intervening layer of cations of the type A. Materials having these structures are well known. The A, B and X cations in the $[A][B][X]_3$ component may be the same as or different from those in the $[A]_2[B][X]_4$ component. A solid solution may be formed.

The term "metal halide perovskite", as used herein, refers to a perovskite, the formula of which contains at least one metal cation and at least one halide anion. These may have formula $[A][B][X]_3$ or $[A]_2[B][X]_4$ as defined above but each B is typically denoted M to represent the at least one metal, as in $[A][M][X]_3$ or $[A]_2[M][X]_4$, where X represents halide.

The term "mixed halide perovskite" as used herein refers to a perovskite or mixed perovskite which contains at least two types of halide anion.

The term "mixed cation perovskite" as used herein refers to a perovskite of mixed perovskite which contains at least two types of A cation.

As used herein, the term "optionally substituted" means that the group at issue may or may not bear substituents, i.e. it may be unsubstituted or substituted. For instance, the group may bear 0, 1, 2, 3 or more substituents; typically 0, 1 or 2 substituents. The substituents may typically be selected from substituted or unsubstituted $C_1$-$C_{20}$ alkyl, substituted or unsubstituted aryl (as defined herein), cyano, amino, $C_1$-$C_{10}$ alkylamino, di($C_1$-$C_{10}$)alkylamino, arylamino, diarylamino, arylalkylamino, amido, acylamido, hydroxy, oxo, halo, carboxy, ester, acyl, acyloxy, $C_1$-$C_{20}$ alkoxy, aryloxy, haloalkyl, sulfonic acid, sulfhydryl (i.e. thiol, —SH), $C_1$-$C_{10}$ alkylthio, arylthio, and sulfonyl.

As used herein, an alkyl group can be a substituted or unsubstituted, linear or branched chain saturated radical, it is often a substituted or an unsubstituted linear chain saturated radical, more often an unsubstituted linear chain saturated radical. An alkyl group typically comprises 1 to 20 carbon atoms, usually 1 to 10 carbon atoms. A $C_{1-10}$ alkyl group is an unsubstituted or substituted, straight or branched chain saturated hydrocarbon radical, having from 1 to 10 carbon atoms. A $C_{1-6}$ alkyl group is an unsubstituted or substituted, straight or branched chain saturated hydrocarbon radical, having from 1 to 6 carbon atoms. Typically it is, for example, methyl, ethyl, propyl, i-propyl, n-propyl, butyl, t-butyl, s-butyl, n-butyl, pentyl, or hexyl. Often an alkyl group is a CM alkyl group. If the term "alkyl" is used without a prefix specifying the number of carbons anywhere herein, it generally has from 1 to 20 carbons (and this also applies to any other organic group referred to herein).

As used herein, an alkenyl group can be a substituted or unsubstituted, linear or branched chain unsaturated radical, it is often a substituted or an unsubstituted linear chain unsaturated radical, more often an unsubstituted linear chain unsaturated radical. An alkenyl group can comprise one or more carbon-carbon double bonds, for example one, two or three double bonds. Typically, an alkenyl group comprises one double bond. An alkenyl group typically comprises 2 to 20 carbon atoms, usually 2 to 10 carbon atoms. A $C_{2-10}$ alkenyl group is an unsubstituted or substituted, straight or branched chain unsaturated hydrocarbon radical, having from 2 to 10 carbon atoms. A $C_{2-6}$ alkenyl group is an unsubstituted or substituted, straight or branched chain unsaturated hydrocarbon radical, having from 2 to 6 carbon atoms. Typically it is, for example, vinyl, propenyl, prop-1-enyl, prop-2-enyl, butenyl, but-1-enyl, but-2-enyl, but-4-enyl, pentenyl, pent-1-enyl, pent-2-enyl, pent-3-enyl, pent-4-enyl, hexenyl, hex-1-enyl, hex-2-enyl, hex-3-enyl, hex-4-eny, or hex-5-enyl.

As used herein, a cycloalkyl group can be a substituted or unsubstituted, cyclic saturated radical, and it is often an unsubstituted cyclic saturated radical. A cycloalkyl group typically comprises from 3 to 20 carbon atoms. A $C_{3-10}$ cycloalkyl group is an unsubstituted or substituted, cyclic saturated hydrocarbon radical, having from 3 to 10 carbon atoms. A $C_{3-6}$ cycloalkyl group is an unsubstituted or substituted, cyclic saturated hydrocarbon radical, having from 3 to 6 carbon atoms Typically it is, for example, cyclopropyl, cyclobutyl, cyclopentyl or cyclohexyl.

As used herein, a cycloalkenyl group can be a substituted or unsubstituted, cyclic unsaturated radical, and it is often an unsubstituted cyclic unsaturated radical. A cycloalkenyl group typically comprises from 3 to 20 carbon atoms. A cycloalkenyl group may comprise one or more double bonds (dependent on the number of carbon atoms present in the ring). A $C_{4-10}$ cycloalkenyl group is an unsubstituted or substituted, cyclic unsaturated hydrocarbon radical, having from 4 to 10 carbon atoms. A $C_{4-10}$ cycloalkenyl group is an unsubstituted or substituted, cyclic unsaturated hydrocarbon radical, having from 3 to 6 carbon atoms Typically it is, for example, cyclobutenyl, cyclopentenyl or cyclohexenyl.

As used herein, an aryl group is a substituted or unsubstituted, monocyclic or bicyclic aromatic group which typically contains from 6 to 14 carbon atoms, often from 6 to 12 carbon atoms and preferably from 6 to 10 carbon atoms in the ring portion. A $C_{6-12}$ aryl group is a substituted or unsubstituted, monocyclic or bicyclic aromatic group which contains from 6 to 12 carbon atoms. Examples include phenyl, naphthyl, indenyl and indanyl groups.

As used herein, an amino group is a radical of formula —$NR_2$, wherein each R is a substituent. R is usually selected from hydrogen, alkyl, alkenyl, cycloalkyl, or aryl, wherein each of alkyl, alkenyl, cycloalkyl and aryl are as defined herein. Typically, each R is selected from hydrogen, $C_{1-10}$ alkyl, $C_{2-10}$ alkenyl, and $C_{3-10}$ cycloalkyl. Preferably, each R is selected from hydrogen, $C_{1-6}$ alkyl, $C_{2-6}$ alkenyl, and $C_{3-6}$ cycloalkyl. More preferably, each R is selected from hydrogen and $C_{1-6}$ alkyl.

A typical amino group is an alkylamino group, which is a radical of formula —$NR_2$ wherein at least one R is an alkyl group as defined herein. A $C_{1-6}$ alkylamino group is an alkylamino group comprising 1 to 6 carbon atoms.

As used herein, an imino group is a radical of formula $R_2C=N$— or —$C(R)=NR$, wherein each R is a substituent. That is, an imino group is a radical comprising a C=N moiety, having the radical moiety either at the N atom or attached to the C atom of said C=N bond. R is as defined herein: that is, R is usually selected from hydrogen, alkyl, alkenyl, cycloalkyl, or aryl, wherein each of alkyl, alkenyl, cycloalkyl and aryl are as defined herein. Typically, each R is selected from hydrogen, $C_{1-10}$ alkyl, $C_{2-10}$ alkenyl, and $C_{3-10}$ cycloalkyl. Preferably, each R is selected from hydrogen, $C_{1-6}$ alkyl, $C_{2-6}$ alkenyl, and $C_{3-6}$ cycloalkyl. More preferably, each R is selected from hydrogen and $C_{1-6}$ alkyl.

A typical imino group is an alkylimino group, which is a radical of formula $R_2C=N$— or —$C(R)=NR$ wherein at least one R is an alkyl group as defined herein. A $C_{1-6}$ alkylimino group is an alkylimino group wherein the R substituents comprise from 1 to 6 carbon atoms.

The term "band gap", as used herein, refers to the energy difference between the top of the valence band and the bottom of the conduction band in a material. The skilled person of course is readily able to measure the band gap of a semiconductor (including that of a perovskite) by using well-known procedures which do not require undue experimentation. For instance, the band gap of a semiconductor can be estimated by constructing a photovoltaic diode or solar cell from the semiconductor and determining the photovoltaic action spectrum. Alternatively the band gap can be estimated by measuring the light absorption spectra either via transmission spectrophotometry or by photo thermal deflection spectroscopy. The band gap can be determined by making a Tauc plot, as described in Tauc, J., Grigorovici, R. & Vancu, a. Optical Properties and Electronic Structure of Amorphous Germanium. Phys. Status Solidi 15, 627-637 (1966) where the square of the product of absorption coefficient times photon energy is plotted on the Y-axis against photon energy on the x-axis with the straight line intercept of the absorption edge with the x-axis giving the optical band gap of the semiconductor. Alternatively, the optical band gap may be estimated by taking the onset of the incident photon-to-electron conversion efficiency, as described in [Barkhouse D A R, Gunawan O, Gokmen T, Todorov T K, Mitzi D B. Device characteristics of a 10.1% hydrazineprocessed Cu2ZnSn(Se,S)4 solar cell. Progress in Photovoltaics: Research and Applications 2012; published online DOI: 10.1002/pip.1160.]

The term "layer", as used herein, refers to any structure which is substantially laminar in form (for instance extending substantially in two perpendicular directions, but limited in its extension in the third perpendicular direction). A layer may have a thickness which varies over the extent of the layer. Typically, a layer has approximately constant thickness. The "thickness" of a layer, as used herein, refers to the average thickness of a layer. The thickness of layers may easily be measured, for instance by using microscopy, such as electron microscopy of a cross section of a film, or by surface profilometry for instance using a stylus profilometer.

The term "porous", as used herein, refers to a material within which pores are arranged. Thus, for instance, in a porous material the pores are volumes within the scaffold where there is no material. Pores in a material may include "closed" pores as well as open pores. A closed pore is a pore in a material which is a non-connected cavity, i.e. a pore which is isolated within the material and not connected to any other pore and which cannot therefore be accessed by a fluid to which the material is exposed. An "open pore" on the other hand, would be accessible by such a fluid. The concepts of open and closed porosity are discussed in detail in J. Rouquerol et al., "Recommendations for the Characterization of Porous Solids", Pure & Appl. Chem., Vol. 66, No. 8, pp. 1739-1758, 1994. Open porosity, therefore, refers to the fraction of the total volume of the porous material in which fluid flow could effectively take place. It therefore excludes closed pores. The term "open porosity" is interchangeable with the terms "connected porosity" and "effective porosity", and in the art is commonly reduced simply to "porosity". The term "without open porosity", as used herein, therefore refers to a material with no effective porosity. The term "non-porous" as used herein, refers to a material without any porosity, i.e. without open porosity and also without closed porosity.

The term "semiconductor" or "semiconducting material", as used herein, refers to a material with electrical conductivity intermediate in magnitude between that of a conductor and a dielectric. A semiconductor may be an negative (n)-type semiconductor, a positive (p)-type semiconductor or an intrinsic (i) semiconductor. A semiconductor may have a band gap of from 0.5 to 3.5 eV, for instance from 0.5 to 2.5 eV or from 1.0 to 2.0 eV (when measured at 300 K).

The term "n-type region", as used herein, refers to a region of one or more electron-transporting (i.e. n-type) materials. Similarly, the term "n-type layer" refers to a layer of an electron-transporting (i.e. an n-type) material. An electron-transporting (i.e. an n-type) material could be a single electron-transporting compound or elemental material, or a mixture of two or more electron-transporting compounds or elemental materials. An electron-transporting compound or elemental material may be undoped or doped with one or more dopant elements.

The term "p-type region", as used herein, refers to a region of one or more hole-transporting (i.e. p-type) materials. Similarly, the term "p-type layer" refers to a layer of a hole-transporting (i.e. a p-type) material. A hole-transporting (i.e. a p-type) material could be a single hole-transporting compound or elemental material, or a mixture of two or more hole-transporting compounds or elemental materials. A hole-transporting compound or elemental material may be undoped or doped with one or more dopant elements.

The term "disposing on", as used herein, refers to the making available or placing of one component on another component. The first component may be made available or placed directly on the second component, or there may be a third component which intervenes between the first and second component. For instance, if a first layer is disposed on a second layer, this includes the case where there is an intervening third layer between the first and second layers. Typically, however, "disposing on" refers to the direct placement of one component on another.

The term "electrode material", as used herein, refers to any material suitable for use in an electrode. An electrode material will have a high electrical conductivity. The term "electrode" as used herein indicates a region or layer consisting of, or consisting essentially of, an electrode material.

The term "optoelectronic device", as used herein, refers to devices which source, control, detect or emit light. Light is understood to include any electromagnetic radiation. Examples of optoelectronic devices include photovoltaic devices, photodiodes, solar cells, photodetectors, phototransistors, photomultipliers, photoresistors, chromogenic devices, light-sensitive transistors, light emitting devices, light emitting diodes and charge injection lasers.

The term "phosphor" as used herein indicates a material which absorbs photons of a first energy and emits photons of a second energy, wherein the second energy is lower than the first energy. For instance, a phosphor may absorb photons with a wavelength of 405 nm and emit photons with a wavelength of 467 nm.

The term "consisting essentially of" refers to a composition comprising the components of which it consists essentially as well as other components, provided that the other components do not materially affect the essential characteristics of the composition. Typically, a composition consisting essentially of certain components will comprise greater than or equal to 95 wt % of those components or greater than or equal to 99 wt % of those components.

Perovskites of Formula (I)

In a first aspect, the invention provides a perovskite of formula (I)

$$[Rb_xCs_{(1-x)}][Pb][Br_yCl_{(1-y)}]_3 \quad (I)$$

wherein x is greater than 0 and less than 1, and y is greater than 0 and less than 1.

The advantages of these specific compounds can be seen from the Tables in the Examples section below, by comparing mixed cation lead halide perovskites and mixed halide lead halide perovskites to the species now claimed.

Table 1 illustrates the photo luminescence quantum yield (PLQY, a measure of emission strength) as a function of chloride content in a mixed halide perovskite, $CsPb(Br/Cl)_3$.

The absorbance and emission of this mixed halide perovskite is also shown in FIG. 1. It can be seen that, as the amount of chloride in the perovskite increases from zero, up to 70% of the total halide content, the emission peak wavelength decreases. That is, the emission of the resulting perovskite moves towards the blue region of the spectrum. However, the PLQY drops significantly as the chloride content increases. A caesium lead halide perovskite containing 50% chloride and 50% bromide (as percentages of total halide content) can be seen to emit only about half as efficiently as the pure caesium lead bromide perovskite.

Figure 6:
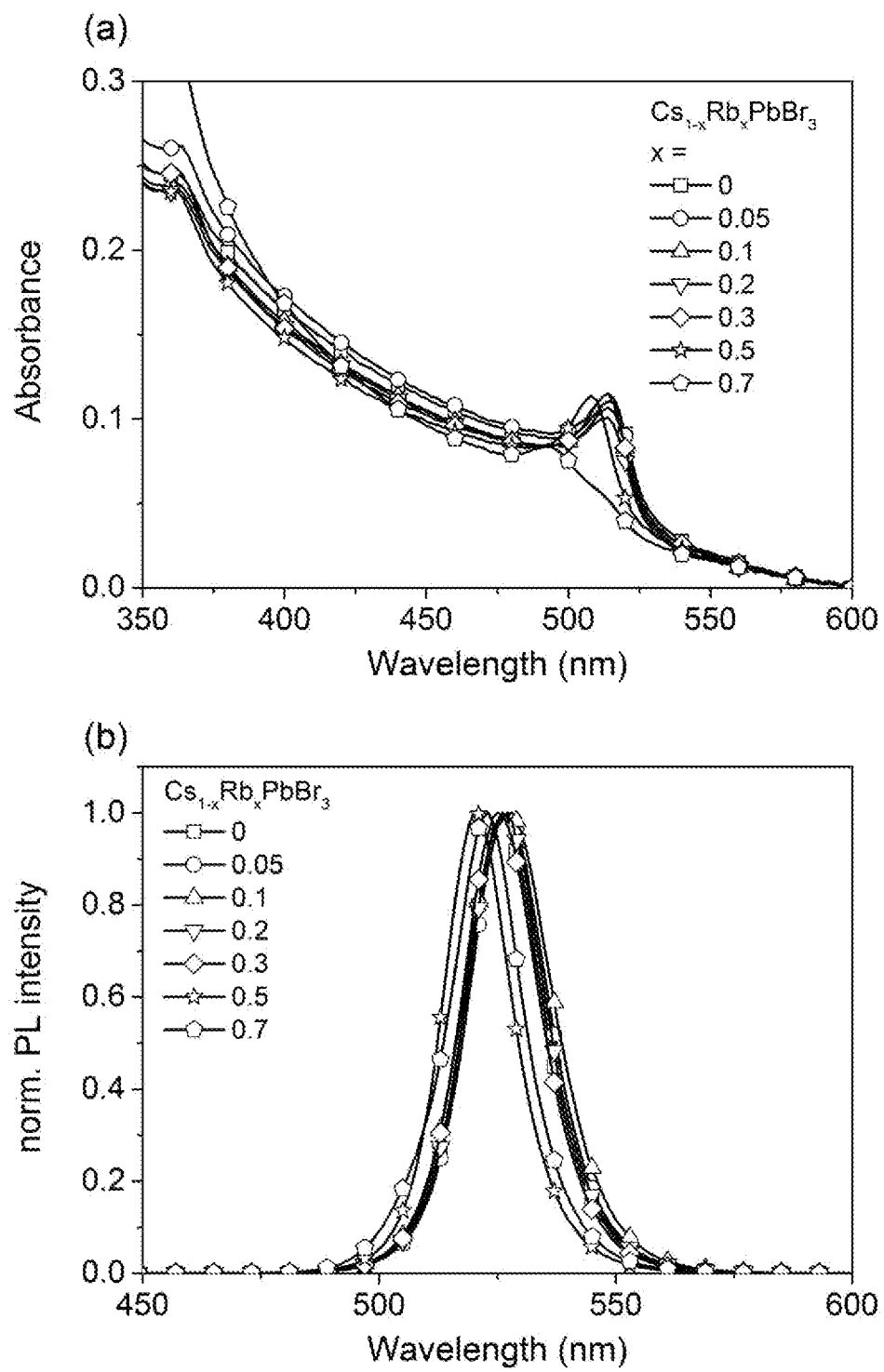
FIG. 6: (a) absorption spectra, and (b) normalised steady-state photoluminescence spectra of $Cs_{1-x}Rb_xPbBr_3$ thin films.

Table 6 illustrates the PLQY as a function of rubidium content in a mixed cation perovskite, $(Cs/Rb)PbBr_3$. The absorption and emission properties of these species are also shown in FIG. 6. It can be seen that, as the amount of rubidium in the perovskite increases from zero to 70% of the total monocation content, there is little change in the peak emission wavelength. Thus, there is no trend in emission wavelength towards the blue region of the spectrum.

However, surprisingly, Table 3 shows that compounds of formula (I) as defined herein have a tunable emission wavelength in the blue region of the spectrum with good PLQY. Peak emission wavelength and PLQY are shown as a function of rubidium content in the mixed-halide mixed-cation perovskite $(Cs/Rb)Pb(Br_{0.5}Cl_{0.5}))_3$. It can be seen that, as the rubidium content increases from 0 to 20% of the total monocation content, the emission wavelength moves somewhat towards the blue region of the spectrum and the emission efficiency PLQY increases. It is further possible to see that a perovskite of this formula containing 70% rubidium (as a percentage of total monocation content) emits at 464 nm, very far into the blue region of the spectrum. Moreover, as can be seen in the absorbance data shown in Figure (3a) for this species, the $Cs_{0.3}Rb_{0.7}Pb(Br_{0.5}Cl_{0.5}))_3$ species absorbs strongly at around 450 nm. Strong absorbance properties in the blue region of the spectrum are most useful in applications where the absorption of visible light is required, for instance in materials used in the manufacture of solar cells.

Figure 8:
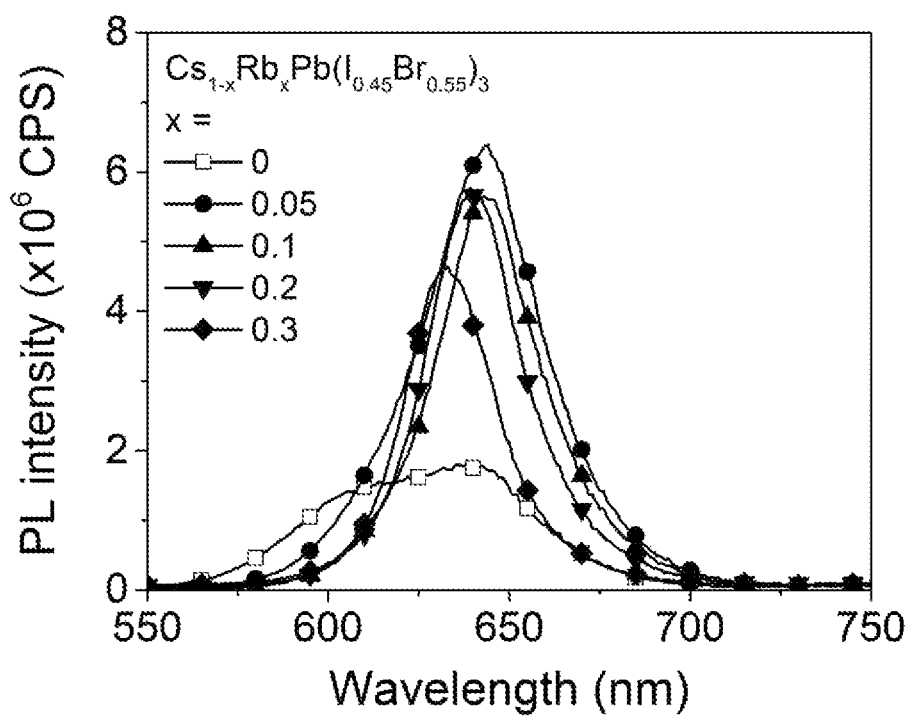
FIG. 8: Steady-state photoluminescence spectra of $Cs_{1-x}Rb_xPb(I_{0.45}Br_{0.55})_3$ thin films.

For comparison, FIG. 8 illustrates the absolute photoluminescence intensity (an indication of PLQY) for the mixed cation and mixed halide lead perovskite $Cs_{1-x}Rb_xPb(I_{0.45}Br_{0.55})_3$. The perovskite containing no rubidium shows a broad emission peak stretching roughly between 600 and 640 nm, in the orange of red region of the visible spectrum. However, as the rubidium content increases above 0% of the total monocation content, the peak emission wavelength shifts further towards the red region of the spectrum, not the blue. As the rubidium content increases from 0.05% to 30% of the total monocation content, the peak emission wavelength starts to move from the red towards the orange region of the visible spectrum, and the photoluminescence decreases (visible in the peak's decreasing size). Thus, $Cs_{1-x}Rb_xPb(I_{0.45}Br_{0.55})_3$ does not follow the same behaviour with rubidium content as the compounds of formula (I).

In one embodiment, therefore, the compounds of the invention and particularly the perovskites of formula (I) have a PLQY the same as or better than $CsPbBr_3$ or $CsPbCl_3$.

Further, the perovskites of formula (I) may emit light having a wavelength of less than 500 nm. For example, the perovskites of formula (I) may emit light having a wavelength of from 450 to 495 nm, preferably from about 455 to 495 nm, more preferably from about 460 to 490, more preferably from 460 to 485 nm, more preferably from 465 to 480 nm. Of course, this does not preclude that the perovskite may emit light having other wavelengths.

The perovskites of formula (I) may have a peak emission wavelength, for instance a peak photoluminescence emission wavelength, of less than 500 nm. Typically, the perovskite of formula (I) may have a peak emission wavelength, for instance a peak photoluminescence emission wavelength, of from 450 to 495 nm, preferably from about 455 to 495 nm, more preferably from about 460 to 490, more preferably from 460 to 485 nm, and most preferably from 465 to 480 nm.

Figure 10:
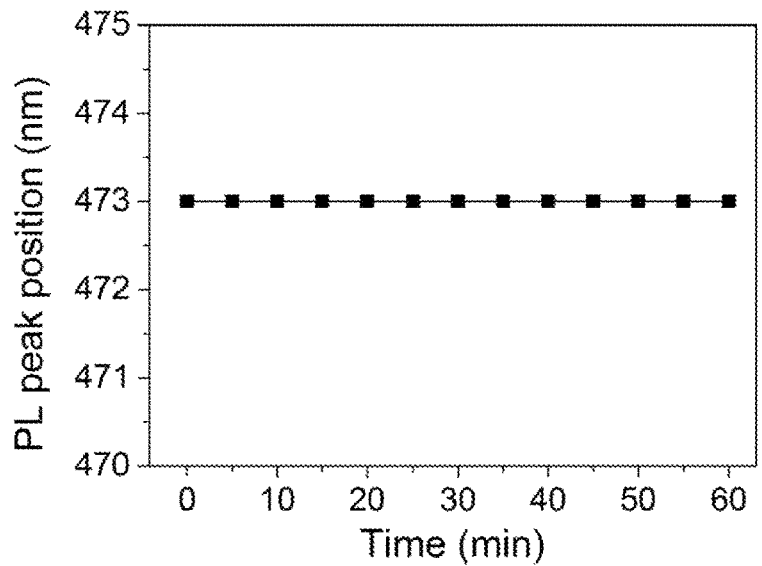
FIG. 10: photoluminescence peak position of $(Cs_{0.6}Rb_{0.4})Pb(Br_{0.5}Cl_{0.5})_3$ under ultraviolet light irradiation for periods of up to 60 minutes.

Further, the photoluminescence of compounds of formula (I) is highly stable. It is known that perovskite species comprising more than one type of halide can be prone to shifts in the peak photoluminescence wavelength over time, which is typically attributed to halide segregation. However, compounds of formula (I) are resistant to such shifts. FIG. 10 illustrates the photoluminescence peak position of $(Cs_{0.6}Rb_{0.4})Pb(Br_{0.5}Cl_{0.5})_3$ under exposure to UV light for various periods of time. Even at exposures as long as 60 minutes, the photoluminescence peak position remains unchanged. Although the data is not shown in FIG. 10, exposures exceeding 60 minutes also did not lead to a significant shift of the photoluminescence peak position.

In one embodiment, therefore, the compounds of the invention and particularly the perovskites of formula (I) have a photoluminescence peak position that remains constant under exposure to UV light (e.g. 365 nm light) for at least 30 minutes, or at least 60 minutes.

Typically, each of Rb, Cs, Cl and Br are present in a non-negligible amount. Typically, therefore, in the perovskite of formula (I) $[Rb_xCs_{(1-x)}][Pb][Br_yCl_{(1-y)}]_3$, x is greater than 0.01. Preferably, x is greater than 0.05, for instance greater than 0.1 or 0.15.

Usually, x is from 0.01 to 0.99. Preferably, x is from 0.05 to 0.95, more preferably from 0.1 to 0.9. In one embodiment, x is from 0.1 to 0.5. In another embodiment, x is from 0.2 to 0.8, preferably from 0.3 to 0.7. Preferably, x is from 0.35 to 0.65; particularly preferably, x is from 0.35 to 0.5, e.g. from 0.35 to 0.45. For instance, x may be 0.4.

Typically, y is greater than greater than 0.01. Preferably, y is greater than 0.05, for instance greater than 0.1 or 0.2.

Usually, y is from 0.01 to 0.99. Preferably, y is from 0.05 to 0.95, more preferably from 0.1 to 0.9. In one embodiment, y is from 0.1 to 0.9, preferably from 0.2 to 0.8, more preferably from 0.3 to 0.7. In a particularly preferred embodiment, y is from 0.4 to 0.6, e.g. from 0.45 to 0.55. For instance, y may be 0.5.

Usually, therefore, x is from 0.01 to 0.99 and y is from 0.01 to 0.99. Preferably, x is from 0.05 to 0.95 and y is from 0.05 to 0.95. Particularly preferably, x is from 0.1 to 0.9 and y is from 0.1 to 0.9. In a particularly preferred embodiment, x is from 0.35 to 0.65 and y is from 0.4 to 0.6; for instance, x is from 0.35 to 0.45 and y is from 0.4 to 0.6 or from 0.45 to 0.55. Thus, it may for instance be that x is 0.4 and y is 0.5.

The compounds of formula (I) have been found to emit blue light in a stable manner with surprisingly good photoluminescence quantum yield. Accordingly, the invention provides the use of a perovskite of formula (I)

$$[Rb_xCs_{(1-x)}][Pb][Br_yCl_{(1-y)}]_3 \qquad (I)$$

wherein x is greater than 0 and less than 1, and y is greater than 0 and less than 1, in the emission of blue light. Typically, the perovskite of formula (I) is used to emit light having a wavelength of less than 500 nm, e.g. from about 450 to 495 nm, preferably from about 455 to 495 nm, more preferably from about 460 to 490, more preferably from 460 to 485 nm, and most preferably from 465 to 480 nm. For instance, the perovskite of formula (I) may be used to emit light having a peak emission wavelength, for instance a peak photoluminescence emission wavelength, of less than 500 nm, e.g. from about 450 to 495 nm, preferably from about 455 to 495 nm, more preferably from about 460 to 490, more preferably from 460 to 485 nm, most preferably from 465 to 480 nm.

In the use of the compound of formula (I) according to the invention, x is typically from 0.1 to 0.9 and y is from 0.1 to 0.9. In a preferred embodiment, x is from 0.35 to 0.65 and y is from 0.4 to 0.6; for instance, x is from 0.35 to 0.45 and y is from 0.4 to 0.6 or from 0.45 to 0.55.

For example, herein is described the use of a compound of formula (I)

$$[Rb_xCs_{(1-x)}][Pb][Br_yCl_{(1-y)}]_3 \quad (I)$$

to emit light having a wavelength of from 460 to 485 nm, wherein x is from 0.35 to 0.65 and y is from 0.4 to 0.6; preferably, wherein x is from 0.35 to 0.45 and y is from 0.45 to 0.55.

Perovskites of Formula (II)

In a second aspect, the invention provides a mixed perovskite of formula (II)

$$\{[A]_2[M][X]_4\}_a\{[Rb_bCs_{(1-b)}][Pb][Br_cCl_{(1-c)}]_3\}_{1-a} \quad (II)$$

wherein
 [A] comprises one or more A cations which are organic monocations;
 [M] comprises one or more M cations which are metal or metalloid dications;
 [X] comprises one or more X anions which are halide anions;
 a is greater than 0 and less than 1;
 b is from 0 to 1,
 c is from 0 to 1, and
 at least one of b and c is greater than 0 and less than 1.

Mixed perovskites of formula (II) may also be referred to as "mixed 2D/3D perovskites". However, despite their mixed 2D/3D structure, these mixed compounds can consist of a single crystalline material, rather than multiple crystalline materials each having a different chemical composition. These mixed dimensionality perovskites are often termed Ruddlesden-Popper phases, and are described in detail in "Ruddlesden-Popper hybrid lead iodide perovskite 2D homologous semiconductors", Stoumpos et al, Chem. Mater; 2016, 28, 2852-2867.

In a further aspect, the invention provides a mixture comprising:
 (a) a compound of formula $[A]_2[M][X]_4$,
  wherein
   [A] comprises one or more A cations which are organic monocations;
   [M] comprises one or more M cations which are metal or metalloid dications;
   [X] comprises one or more X anions which are halide anions;
 and
 (b) a compound of formula $[Rb_bCs_{(1-b)}][Pb][Br_cCl_{(1-c)}]_3$
  wherein
   b is from 0 to 1,
   c is from 0 to 1, and
   at least one of b and c is greater than 0 and less than 1.

By a "mixture" can be meant a physical admixture of the two component compounds of the mixture. For example, the mixture may comprise the compound of formula $[A]_2[M][X]_4$, and the compound of formula $[Rb_bCs_{(1-b)}][Pb][Br_cCl_{(1-c)}]_3$ both in powder or crystalline form, wherein particles (e.g. powder or crystals) of one component are distributed among particles of the other component. For instance, particles of the compound of formula $[A]_2[M][X]_4$, and particles of the compound of formula $[Rb_bCs_{(1-b)}][Pb][Br_cCl_{(1-c)}]_3$ may be co-localised within a medium such as a matrix, or upon a substrate.

In another embodiment, the mixture may comprise a crystalline material comprising crystal grains of both the compound of formula $[A]_2[M][X]_4$, and the compound of formula $[Rb_bCs_{(1-b)}][Pb][Br_cCl_{(1-c)}]_3$.

Mixed perovskites of formula (II) and mixtures according to the invention have the same surprising advantages as the compounds of formula (I). That is, they show surprisingly efficient emission and absorption in the blue region of the visible spectrum, and their peak emission wavelength can be tuned by adjustment.

These advantages are illustrated by the data in the Tables shown in the Examples section below.

Figure 7:
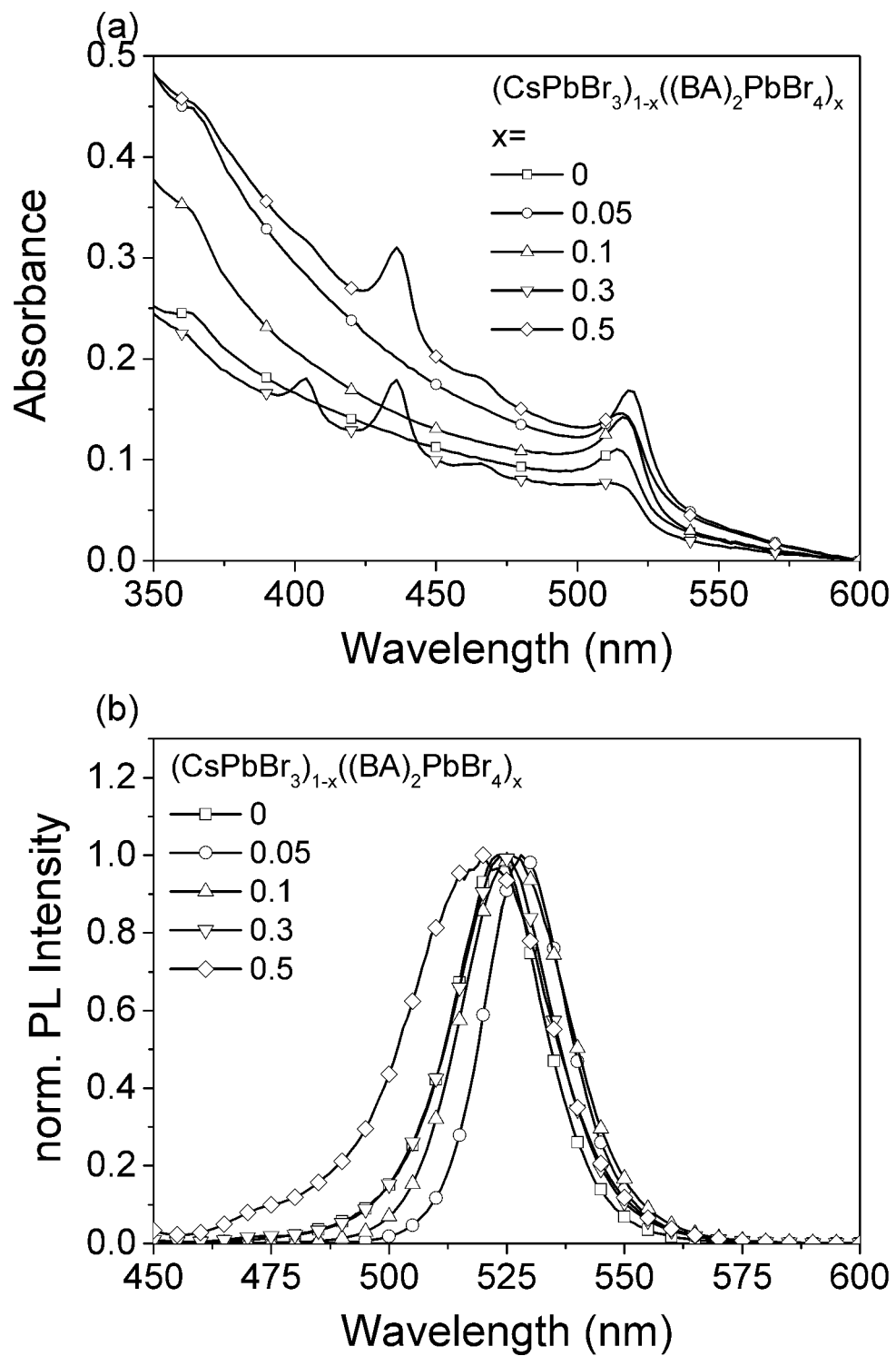
FIG. 7: (a) absorption spectra, and (b) normalised steady-state photoluminescence spectra of $(CsPbBr_3)_{1-x}((BA)_2PbBr_4)_x$ thin films.

Table 7 and FIG. 7 illustrate the emission characteristics of a mixed 2D/3D perovskite outside the scope of the invention, wherein b is 0 and c is 1. It can be seen that these species all emit outside the blue region of the spectrum. Moreover, although increasing the amount of $[A]_2[M][X]_4$ species does not allow the emission spectrum to be tuned into the blue region of the visible. Introduction of $[A]_2[M][X]_4$ (where x=0.05, 0.1 and 0.3) can in fact increase the peak emission wavelength, moving it towards the red. Increasing the $[A]_2[M][X]_4$ content further, such that x=0.5, does move the emission wavelength slightly towards the blue region of the spectrum. However, the peak position of 519 nm is still firmly in the green and moreover the PLQY of this species is only half that of the CsPbBr$_3$ 3D perovskite species.

Figure 2:
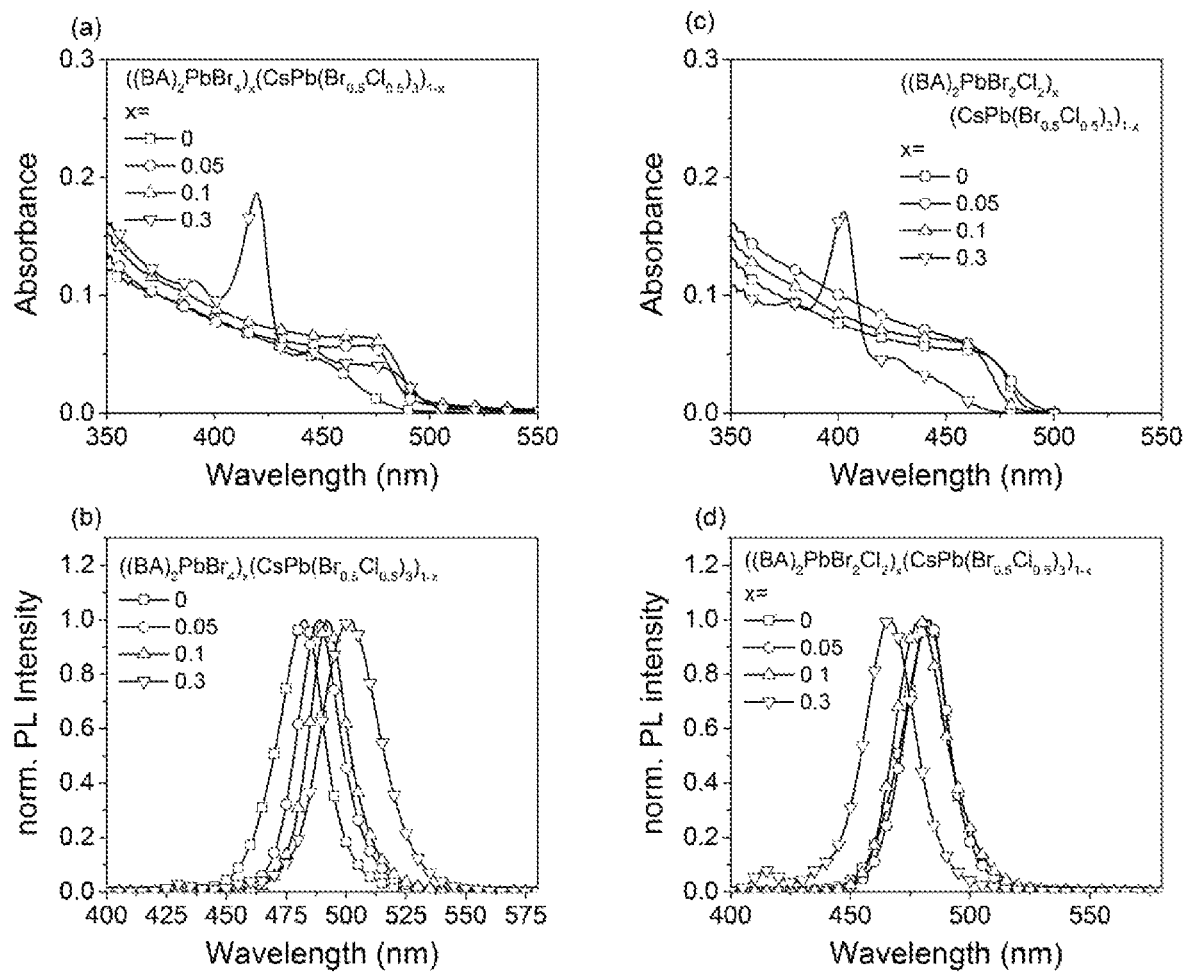
FIG. 2: (a and c) absorption spectra, and (b and d) normalised steady-state photoluminescence spectra of the perovskite thin films fabricated from $CsPb(Br_{0.5}Cl_{0.5})_3$ mixed with different concentration of (left) $(BA)_2PbBr_4$ and (right) $(BA)_2PbBr_2Cl_2$.

By contrast, the data in Table 2 and FIG. 2 shows that the combination of $[A]_2[M][X]_4$ and CsPb(Br$_{0.5}$Cl$_{0.5}$)$_3$ provides a species which emits in the blue region of the visible spectrum, tunable at least between 482 nm and 476 nm. Moreover, the PLQY of such species is surprisingly high: the (CsPb(Br$_{0.5}$Cl$_{0.5}$)$_3$)$_{0.7}$((BA)$_2$PbBr$_4$)$_{0.3}$ emits far into the blue, at 476 nm, and moreover emits more efficiently than CsPb(Br$_{0.5}$Cl$_{0.5}$)$_3$. BA is butylaluminium.

The effect shown in Table 2 and FIG. 2 for the mixed halide species is also observed for mixed monocation species. Table 4 illustrates the emission properties of ((BA)$_2$PbBr$_4$)$_x$(Cs$_{0.6}$Rb$_{0.4}$Pb(Br$_{0.5}$Cl$_{0.5}$)$_3$)$_{1-x}$. As x increases from 0 to 0.1 (that is, as the $[A]_2[M][X]_4$ species is introduced), the PLQY of this species more than doubles. Moreover, as the photo luminescence spectrum in FIG. 4(b) shows, although the peak emission wavelength moves to 480 nm (still in the blue region of the spectrum), the emission spectrum broadens and emission at low wavelengths, even below 450 nm, is observed.

Figure 11:
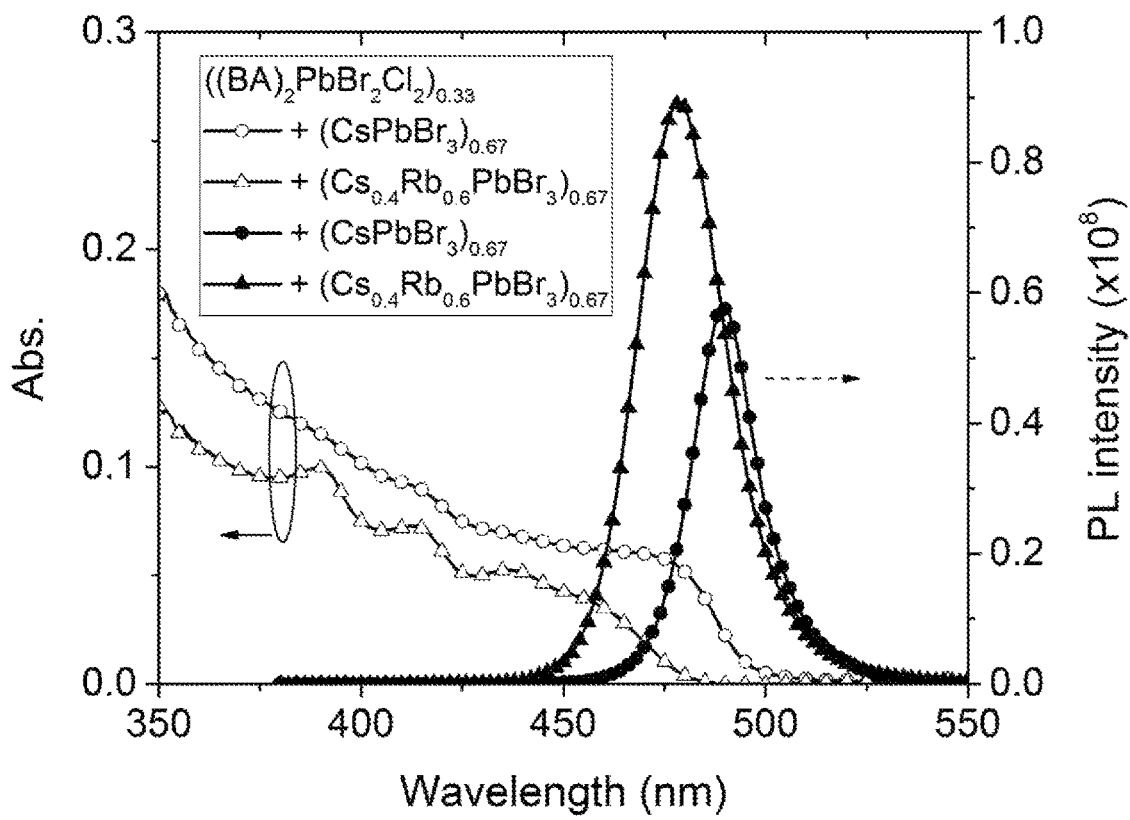
FIG. 11: steady-state photoluminescence (SSPL) spectra and absorption spectra of $((BA)_2Pb(Br_2Cl_2)_4)_{0.33}(CsPbBr_3)_{0.67}$ and $((BA)_2Pb(Br_2Cl_2)_4)_{0.33}(Cs_{0.4}Rb_{0.6}PbBr_3)_{0.67}$ thin films.

The effect of mixing the monocation moiety in the [Rb$_b$Cs$_{(1-b)}$][Pb][Br$_c$Cl$_{(1-c)}$]$_3$ moiety is also illustrated in FIG. 11 and Table 8. Increasing b from 0 to 0.4 causes a dramatic shift in photoluminescence peak position from 489 to 478, and a significant increase in photoluminescence quantum yield. The combined blue shift and PLQY increase is unusual and highly advantageous for the production of blue light.

In one embodiment, therefore, the compounds of the invention and particularly the mixed perovskites of formula (II) and the mixtures of the invention have a PLQY the same as or greater than CsPbBr$_3$ or CsPbCl$_3$. In a preferred embodiment, the mixed perovskites of formula (II) and the mixtures of the invention have a PLQY the same as or greater than the PLQY of CsPb(Br$_c$Cl$_{1-c}$)$_3$, wherein c is greater than 0 and less than 1. In another preferred embodiment, the mixed perovskites of formula (II) and the mixtures of the invention have a PLQY the same as or greater than the PLQY of $Cs_bRb_{1-b}PbBr_3$, wherein b is greater than 0 and less than 1. In another preferred embodiment, the mixed perovskites of formula (II) and the mixtures of the invention have a PLQY the same as or greater than the PLQY of $Cs_bRb_{1-b}PbCl_3$, wherein b is greater than 0 and less than 1.

In a particular embodiment of the invention, the mixed perovskites of formula (II) and the mixtures of the invention have a PLQY the same as or greater than the PLQY of $Cs_bRb_{1-b}Pb(Br_cCl_{1-c})_3$, wherein b and c are both greater than 0 and less than 1.

Typically, therefore, the mixed perovskites of formula (II) and the mixtures of the invention emit light in the blue region of the visible spectrum. For instance, the mixed perovskites of formula (II) and the mixture may emit light having a wavelength of from 450 to 495 nm, preferably from 460 to 495 nm, and more preferably from 465 to 490 nm. In some cases the mixed perovskites of formula (II) and the mixture may emit light having a wavelength of from 470 to 490 nm or 475 to 490 nm. Of course, the mixed perovskites of formula (II) and the mixtures of the invention may emit light having other wavelengths. The mixed perovskites of formula (II) and the mixtures of the invention may have a peak emission wavelength, for instance a photoluminescence peak emission wavelength, of less than 500 nm, preferably of from 450 to 495 nm, preferably from 460 to 495 nm, and more preferably from 465 to 490 nm. In some cases the mixed perovskites of formula (II) and the mixtures of the invention may have a peak emission wavelength, for instance a photoluminescence peak emission wavelength of from 470 to 490 nm or 475 to 490 nm.

Thus, the mixed perovskites of formula (II) and the mixtures of the invention may be used to emit light in the blue region of the visible spectrum. Accordingly, the invention provides the use of a mixed perovskite of formula (II)

$$\{[A]_2[M][X]_4\}_a\{[Rb_bCs_{(1-b)}][Pb][Br_cCl_{(1-c)}]_3\}_{1-a} \quad (II)$$

wherein
[A] comprises one or more A cations which are organic monocations;
[M] comprises one or more M cations which are metal or metalloid dications;
[X] comprises one or more X anions which are halide anions;
a is greater than 0 and less than 1;
b is from 0 to 1,
c is from 0 to 1, and
at least one of b and c is greater than 0 and less than 1, in the emission of blue light.

Typically, the mixed perovskite of formula (II) is used to emit light having a wavelength of less than 500 nm. For instance, the mixed perovskites of formula (II) may be used to emit light having a wavelength of from about 450 to 495 nm, preferably from 460 to 495 nm, more preferably from 465 to 490 nm; for example from 470 to 490 nm or 475 to 490 nm. The mixed perovskites of formula (II) may in particular be used to emit light having a peak emission wavelength, for instance a photoluminescence peak emission wavelength, of less than 500 nm, preferably of from 450 to 495 nm, preferably from 460 to 495 nm, and more preferably from 465 to 490 nm; for example from 470 to 490 nm or 475 to 490 nm.

Similarly, the invention provides the use of a mixture comprising:
(a) a compound of formula $[A]_2[M][X]_4$,
wherein
[A] comprises one or more A cations which are organic monocations;
[M] comprises one or more M cations which are metal or metalloid dications;
[X] comprises one or more X anions which are halide anions;
and
(b) a compound of formula $[Rb_bCs_{(1-b)}][Pb][Br_cCl_{(1-c)}]_3$
wherein
b is from 0 to 1,
c is from 0 to 1, and
at least one of b and c is greater than 0 and less than 1, in the emission of blue light.

Typically, the mixture is used to emit light having a wavelength of less than 500 nm. For instance, the mixture may be used to emit light emit light having a wavelength of from about 450 to 495 nm, preferably from 460 to 495 nm, and more preferably from 465 to 490 nm; for example from 470 to 490 nm or 475 to 490 nm. The mixture may in particular be used to emit light having a peak emission wavelength, for instance a photoluminescence peak emission wavelength, of less than 500 nm, preferably of from 450 to 495 nm, preferably from 460 to 495 nm, and more preferably from 465 to 490 nm; for example from 470 to 490 nm or 475 to 490 nm.

In the mixed perovskites of formula (II) and the mixtures of the invention, the 3D perovskite component contains a mixture of halides and/or a mixture of monocations. Typically, the 3D perovskite contains a mixture of monocations. Thus, in a preferred embodiment, b is greater than 0 and less than 1.

In a preferred embodiment of the mixed perovskites and the mixtures of the invention, both b and c are greater than 0 and less than 1. As will be appreciated from the Examples, the embodiment wherein both b and c are greater than 0 and less than 1 provides a mixed perovskites of formula (II) or mixture wherein the PLQY is advantageously high, and wherein the emission spectrum extends far into the blue region of the visible spectrum. In a preferred aspect of the invention, particularly wherein b is greater than 0 and less than 1, the emission spectrum of the mixed perovskite of formula (II) or the mixture of the invention extends at least to 450 nm. By "extends at least to 450 nm" is mean that the mixed perovskite or mixture can emit at 450 nm and optionally also at shorter wavelengths.

Where b is greater than 0 and less than 1, typically b is from 0.01 to 0.99. For example, b may be from 0.1 to 0.9. Preferably, b is from 0.2 to 0.8, more preferably from 0.3 to 0.7.

Where c is greater than 0 and less than 1, typically c is from 0.01 to 0.99. For example, c may be from 0.1 to 0.9. Preferably, c is from 0.2 to 0.8, preferably from 0.3 to 0.7.

In the mixed perovskite of formula (II) of the invention, a is greater than 0 and less than 1. The size of a is non-negligible, so a is typically from 0.01 to 0.99. For example, a may be from 0.05 to 0.9, preferably from 0.05 to 0.5.

In the mixture of the invention, the proportion of the amount of the compound of formula $[A]_2[M][X]_4$ in relation to the compound of formula $[Rb_bCs_{(1-b)}][Pb][Br_cCl_{(1-c)}]_3$ can vary. However, both components are present in non-negligible amounts. Accordingly, the molar ratio of $[A]_2[M][X]_4$ to $[Rb_bCs_{(1-b)}][Pb][Br_cCl_{(1-c)}]_3$ is typically within the range 1:99 to 99:1. For example, the molar ratio of $[A]_2[M][X]_4$ to $[Rb_bCs_{(1-b)}][Pb][Br_cCl_{(1-c)}]_3$ may be within the range 5:95 to 90:10. Preferably, the molar ratio of $[A]_2[M][X]_4$ to $[Rb_bCs_{(1-b)}][Pb][Br_cCl_{(1-c)}]_3$ is from 5:95 to 50:50.

The mixed perovskite and mixture of the invention comprise a component of formula $[A]_2[M][X]_4$. [A] may contain one or more individual species of monocation. These individual species are referred to as A. Thus, $[A]_2[M][X]_4$ may contain one or more A. Similarly, [M] may contain one ore more metal or metalloid dication species, each of which is referred to individually as M, and [X] may contain one or more halide anions, or X species. For instance, where the $[A]_2[M][X]_4$ component contains both bromide and chloride anions, the [X] component comprises a first X species which is bromide and a second X species which is chloride.

[A] will be considered first. [A] comprises one or more organic monocations. [A] usually comprises one, two or three A species. Where [A] comprises more than one A species, each A species carries a single positive charge and may be referred to as a monocation.

Preferably, where [A] comprises more than one A species, each A species is an organic monocation. However, A may also be an inorganic species such as $Cs^+$.

Typically, [A] comprises a single A species.

Where an A species is an organic monocation, A is typically an ammonium cation or an iminium cation, each of which may be optionally substituted. For example each A species may be an optionally substituted ammonium cation or an optionally substituted iminium cation.

Where an A species is an organic monocation, A is typically selected from $C_{2-10}$ alkylammonium, $C_{2-10}$ alkenylammonium, $C_{1-10}$ alkyliminium, $C_{3-10}$ cycloalkylammonium and $C_{3-10}$ cycloalkyliminium optionally substituted with one or more substituents selected from amino, $C_{1-6}$ alkylamino, imino, $C_{1-6}$ alkylimino, $C_{1-6}$ alkyl, $C_{2-6}$ alkenyl, $C_{3-6}$ cycloalkyl and $C_{6-12}$ aryl. Where [A] comprises more than one A species, typically each A is selected from this list.

In some embodiments, where an A species is an organic monocation, A is a primary $C_{2-10}$ alkylammonium optionally substituted with one, two or three amino or imino groups. By "primary alkylammonium" is meant an alkylammonium cation where only one of the substituents upon the quaternary nitrogen atom is not hydrogen. In a typical aspect of this embodiment, each A cation is a primary $C_{2-10}$ alkylammonium cation optionally substituted with one, two or three amino or imino groups.

In a preferred embodiment, where an A species is an organic monocation it is selected from ethylammonium, propylammonium. butylammonium, pentylammoium, hexylammonium, septylammonium, octylammonium, benzyl ammonium, phenylethylammonium, benzylammonium, napthylmethylammonium and guanidinium. In a preferred aspect of this embodiment, each A cation is selected from ethylammonium, propylammonium. butylammonium, pentylammoium, hexylammonium, septylammonium, octylammonium, benzyl ammonium, phenylethylammonium, benzylammonium, napthylmethylammonium and guanidinium.

In a particularly preferred embodiment, where an A species is an organic monocation it is a butylammonium species. Preferably, each A cation is butylammonium. That is, in a particularly preferred embodiment, [A] comprises a single A species which is butylammonium.

As used herein, the term "ammonium" indicates an organic cation comprising a quaternary nitrogen. An ammonium cation is a cation of formula $R^1R^2R^3R^4N^+$. $R^1$, $R^2$, $R^3$, and $R^4$ are substituents. Each of $R^1$, $R^2$, $R^3$, and $R^4$ are typically independently selected from hydrogen, or from optionally substituted alkyl, alkenyl, aryl, cycloalkyl, cycloalkenyl and amino; the optional substituent is preferably an amino or imino substituent. Usually, each of $R^1$, $R^2$, $R^3$, and $R^4$ are independently selected from hydrogen, and optionally substituted $C_{1-10}$ alkyl, $C_{2-10}$ alkenyl, $C_{3-10}$ cycloalkyl, $C_{3-10}$ cycloalkenyl, $C_{6-12}$ aryl and $C_{1-6}$ amino; where present, the optional substituent is preferably an amino group; particularly preferably $C_{1-6}$ amino. Preferably, each of $R^1$, $R^2$, $R^3$, and $R^4$ are independently selected from hydrogen, and unsubstituted $C_{1-10}$ alkyl, $C_{2-10}$ alkenyl, $C_{3-10}$ cycloalkyl, $C_{3-10}$ cycloalkenyl, $C_{6-12}$ aryl and $C_{1-6}$ amino. In a particularly preferred embodiment, $R^1$, $R^2$, $R^3$, and $R^4$ are independently selected from hydrogen, $C_{1-10}$ alkyl, and $C_{2-10}$ alkenyl and $C_{1-6}$ amino. Further preferably, $R^1$, $R^2$, $R^3$, and $R^4$ are independently selected from hydrogen, $C_{1-6}$ alkyl, $C_{2-6}$ alkenyl and $C_{1-6}$ amino.

Preferred ammonium cations include $C_{2-10}$ alkylammonium cations, which are cations of formula $R^1R^2R^3R^4N^+$ wherein at least one of $R^1$, $R^2$, $R^3$, and $R^4$ is a $C_{1-10}$ alkyl group. For instance, one of $R^1$, $R^2$, $R^3$, and $R^4$ is a $C_{1-10}$ alkyl group and the other three are hydrogen. For instance, preferred ammonium cations include ethylammonium, butylammonium, pentylammonium and hexylammonium.

Preferred ammonium cations also include $C_{2-10}$ alkenylammonium cations, which are cations of formula $R^1R^2R^3R^4N^+$ wherein at least one of $R^1$, $R^2$, $R^3$, and $R^4$ is an optionally substituted $C_{2-10}$ alkenyl group, preferably an unsubstituted $C_{2-10}$ alkenyl group. For instance, one of $R^1$, $R^2$, $R^3$, and $R^4$ is a $C_{2-10}$ alkenyl group and the other three are hydrogen. For instance, preferred ammonium cations include vinylammonium, propenylammonium, butenylammonium, pentenylammonium and hexenylammonium.

Preferred ammonium cations further include $C_{3-10}$ cycloalkylammonium cations, which are cations of formula $R^1R^2R^3R^4N^+$ wherein at least one of $R^1$, $R^2$, $R^3$, and $R^4$ is a $C_{3-10}$ cycloalkyl group. For instance, one of $R^1$, $R^2$, $R^3$, and $R^4$ is a $C_{3-10}$ cycloalkyl group and the other three are hydrogen. For instance, preferred ammonium cations include cyclopropylammonium, cyclobutylammonium, cyclopentylammonium, and cyclohexylammonium.

As used herein, the term "iminium" indicates an organic cation of formula $(R^1R^2C=NR^3R^4)^+$, wherein $R^1$, $R^2$, $R^3$, and $R^4$ are as defined in relation to the ammonium cation. Thus, in a particularly preferred embodiment, of the iminium cation, $R^1$, $R^2$, $R^3$, and $R^4$ are independently selected from hydrogen, $C_{1-10}$ alkyl, $C_{2-10}$ alkenyl and $C_{1-6}$ amino. In a further preferable embodiment of the iminium cation, $R^1$, $R^2$, $R^3$, and $R^4$ are independently selected from hydrogen, $C_{1-6}$ alkyl, $C_{2-6}$ alkenyl and $C_{1-6}$ amino.

Preferred iminium cations include $C_{1-10}$ alkyliminium cations, which are cations of formula $(R^1R^2C=NR^3R^4)^+$ wherein at least one of $R^1$, $R^2$, $R^3$, and $R^4$ is a $C_{1-10}$ alkyl group. For instance, one of $R^1$, $R^2$, $R^3$, and $R^4$ is a $C_{1-10}$ alkyl group and the other three are hydrogen. For instance, preferred iminium cations include $(H_2N=CH_2)^+$; $(H_2N=CHCH_3)^+$; $(H_2N=C(CH_3)_2)^+$; $(H(CH_3)N=CH_2)^+$; $(H(CH_3)N=CHCH_3)^+$; $(H(CH_3)N=C(CH_3)_2)^+$; $((CH_3)_2N=CH_2)^+$; $((CH_3)_2N=CHCH_3)^+$; $((CH_3)_2N=C(CH_3)_2)^+$; $(H_2N=CHNH_2)^+$; $(H_2N=C(CH_3)(NH_2))^+$; $(H(CH_3)N=CHNH_2)^+$; $(H(CH_3)N=C(CH_3)(NH_2))^+$; $((CH_3)_2N=CHNH_2)^+$; $((CH_3)_2N=C(CH_3)(NH_2))^+$. Particularly preferred is $(H_2N=CHNH_2)^+$. Preferred iminium cations also include $C_{2-10}$ alkenyliminium cations, which are cations of formula $(R^1R^2C=NR^3R^4)^+$ wherein at least one of $R^1$, $R^2$, $R^3$, and $R^4$ is a $C_{2-10}$ alkenyl group. For instance, one of $R^1$, $R^2$, $R^3$, and $R^4$ is a $C_{2-10}$ alkenyl group and the other three are hydrogen.

Further preferred iminium cations include those wherein at least one of $R^1$, $R^2$, $R^3$, and $R^4$ is a $C_{1-6}$ amino group. The $C_{1-6}$ amino group is preferably one of $R^1$ or $R^2$ such that the nitrogen atom of the amino group bonds directly to the carbon of the iminium species. Yet further preferred iminium cations include those wherein at least one of $R^1$ and $R^2$ is a $C_{1-6}$ amino group and wherein at least one of the remaining three groups among $R^1$, $R^2$, $R^3$, and $R^4$ is a $C_{1-10}$ alkyl group.

Preferred iminium cations further include $C_{3-10}$ cycloalkyliminium cations, which are cations of formula $(R^1R^2C=NR^3R^4)^+$ wherein at least one of $R^1$, $R^2$, $R^3$, and $R^4$ is a $C_{3-10}$ cycloalkyl group. For instance, one of $R^1$, $R^2$, $R^3$, and $R^4$ is a $C_{3-10}$ cycloalkyl group and the other three are hydrogen.

[M] will now be considered. [M] comprises one or more metal or metalloid dications, M. [M] may usually comprise one, two or three M species. Where [M] comprises more than one M species, each M species carries a double positive charge and may be referred to as a dication.

Typically, [M] comprises a single M species.

Each metal or metalloid dication M may be a dication derived from any metal in groups 1 to 16 of the periodic table. The metal or metalloid cation may be any suitable metal or metalloid dication. Metalloids are usually taken to be following elements: B, Si, Ge, As, Sb, Te and Po.

Usually, each M cation is selected from $Ca^{2+}$, $Sr^{2+}$, $Cd^{2+}$, $Cu^{2+}$, $Ni^{2+}$, $Mn^{2+}$, $Fe^{2+}$, $Co^{2+}$, $Pd^{2+}$, $Ge^{2+}$, $Sn^{2+}$, $Pb^{2+}$, $Yb^{2+}$ and $Eu^{2+}$. Preferably, the or each metal or metalloid cation M is $Cu^{2+}$, $Pb^{2+}$, $Ge^{2+}$ or $Sn^{2+}$. Often, the or each metal or metalloid cation M is selected from $Pb^{2+}$ or $Sn^{2+}$, particularly preferably $Pb^{2+}$. Thus, in a preferred embodiment, [M] consists of $Pb^{2+}$.

As regards [X], [X] comprises one or more halide anions, X. Typically [X] comprises one, two or three halide species X. Each halide X is selected from $F^-$, $Cl^-$, $Br^-$ and $I^-$, preferably $Cl^-$ or $Br^-$. Thus, in some embodiments, [X] comprises a first species which is $Cl^-$ and a second halide species which is $Br^-$.

Typically, however, [X] comprises a single halide species X. Thus, in preferred embodiments of the mixed perovskite or mixture of the invention, [X] consists of a single X anion selected from $Cl^-$ or $Br^-$.

Accordingly, in a preferred embodiment of the mixed perovskite of formula (II) or the mixture of the invention:
each A is an ammonium or iminium cation as defined herein;
each M is selected from $Cu^{2+}$, $Pb^{2+}$, $Ge^{2+}$ or $Sn^{2+}$; and
each X is selected from $Cl^-$ or $Br^-$.

In a first preferred aspect of this embodiment, in the mixed perovskite of formula (II), a, b and c are each from 0.01 to 0.99. In a second preferred aspect of this embodiment, in the mixture of the invention, b and c are from 0.01 to 0.99 and the molar ratio of $[A]_2[M][X]_4$ to $[Rb_bCs_{(1-b)}][Pb][Br_cCl_{(1-c)}]_3$ is from 1:99 to 99:1.

In a further preferred embodiment of the mixed perovskite of formula (II) or the mixture of the invention:
[A] comprises one, two or three A species wherein each A is an ammonium cation of formula $R^1R^2R^3R^4N^+$ or an iminium cation of formula $(R^1R^2C=NR^3R^4)^+$ wherein each of $R^1$, $R^2$, $R^3$, and $R^4$ are independently selected from hydrogen, and unsubstituted $C_{1-10}$ alkyl, $C_{2-10}$ alkenyl, $C_{3-10}$ cycloalkyl, $C_{3-10}$ cycloalkenyl, $C_{6-12}$ aryl and $C_{1-6}$ amino;
[M] comprises one or two M species selected from $Cu^{2+}$ and $Pb^{2+}$; and
[X] comprises one or two X species selected from $Cl^-$ or $Br^-$.

In a first preferred aspect of this embodiment, in the mixed perovskite of formula (II), a is from 0.01 to 0.9, and b and c are each from 0.1 to 0.9. In a second preferred aspect of this embodiment, in the mixture of the invention, b and c are from 0.1 to 0.9 and the molar ratio of $[A]_2[M][X]_4$ to $[Rb_bCs_{(1-b)}][Pb][Br_cCl_{(1-c)}]_3$ is from 1:99 to 90:10.

In a further preferred embodiment of the mixed perovskite of formula (II) or the mixture of the invention:
[A] comprises one, two or three A species wherein each A is selected from ethylammonium, propylammonium, butylammonium, pentylammoium, hexylammonium, septylammonium, octylammonium, benzyl ammonium, phenylethylammonium, benzylammonium, napthylmethylammonium and guanidinium;
[M] comprises one M species which is $Pb^{2+}$; and
[X] comprises one or two X species selected from $Cl^-$ or $Br^-$.

In a first preferred aspect of this embodiment, in the mixed perovskite of formula (II), a is from 0.05 to 0.5, and b and c are each from 0.2 to 0.8. In a second preferred aspect of this embodiment, in the mixture of the invention, b and c are from 0.2 to 0.8 and the molar ratio of $[A]_2[M][X]_4$ to $[Rb_bCs_{(1-b)}][Pb][Br_cCl_{(1-c)}]_3$ is from 5:95 to 50:50.

Photoactive Material

The invention further provides photoactive material comprising a perovskite of formula (I) as defined herein; and/or a mixed perovskite of formula (II) as defined herein; and/or a mixture as defined herein.

The term "photoactive material", as used herein, refers to a material which can absorb and/or emit photons. A photoactive material can do one or more of the following.
(i) Absorb photons, which may then generate free charge carriers e.g. electrons and holes. These materials are referred to as photoabsorbent materials.
(ii) Absorb photons at energies higher than its band gap and re-emit photons at energies of the band gap (these are referred to as photoemissive materials). One type of photoemissive material is a luminescent material, which is a material that emits light following the absorption of photons, i.e. a phosphorescent or a fluorescent material.
(iii) Accept charge, both electrons and holes, which may subsequently recombine and emit light.

Photoactive materials are therefore examples of semiconducting materials. A semiconductor or semiconducting material as used herein refers to a material with electrical conductivity intermediate in magnitude between that of a conductor and a dielectric. A semiconductor may have a band gap of from 0.5 to 3.5 eV, for instance from 0.5 to 2.5 eV or from 1.0 to 2.0 eV (when measured at 300 K).

The photoactive material of the invention is generally capable of absorbing and/or emitting photons in the visible region of the spectrum, particularly in the blue region of the visible spectrum. For instance, the photoactive material of the invention can typically absorb and/or emit photons of at least one wavelength of 500 nm or less, for example 495 nm or less. In a preferred embodiment, the compounds of the invention have a peak emission wavelength in the range 450 to 500 nm, preferably 455 to 495 nm, particularly preferably 460 to 490 nm. However, photoactive materials which can absorb and emit photons typically do not show peak absorbance and peak emission at exactly the same wavelength.

By peak absorbance is meant the wavelength at which the photoactive material absorbs photons most efficiently, and by peak emission is meant the wavelength at which the photoactive material emits photons most efficiently. Typically, the peak emission of the photoactive material is 500 nm or less, for example 495 nm or less. In a preferred embodiment, the compounds of the invention have a peak emission wavelength in the range 450 to 500 nm, preferably 455 to 495 nm, particularly preferably 460 to 490 nm.

The photoactive material may comprise greater than or equal to 5 wt % of the compound(s) of the invention. Typically at least 50% of the weight of the photoactive materials consists of one or more of the compound of formula (I), and/or the compound of formula (II), and/or the mixture as defined herein. The photoactive material may comprise additional components as discussed herein, for example scaffold materials, matrix materials or coatings. Typically, though, the photoactive material comprises greater than or equal to 80 wt % of the compound(s) of the invention as defined herein. Preferably, the photoactive material comprises greater than or equal to 95 wt % of the compound(s) of the invention as defined herein, for instance greater than or equal to 99 wt % of the compound(s) of the invention as defined herein. The photoactive material may consist, or consist essentially, of the compound(s) of the invention as defined herein.

The photoactive material is typically solid.

The physical form of the compounds of the invention within the photoactive material is not particularly limited. The compounds of the invention may each, where present, be in powder form or in crystalline form.

Where the compound(s) of the invention is/are present in crystalline form, the compound(s) may be crystalline or polycrystalline. A crystalline compound is a compound having an extended 3D crystal structure. A crystalline compound is typically in the form of crystals or, in the case of a polycrystalline compound, crystallites (i.e. a plurality of crystals having particle sizes of less than or equal to 1 μm). The crystals together often form a layer. The crystals of a crystalline material may be of any size. The crystals of the compound(s) of the invention when in crystalline form (not polycrystalline form) typically have a smallest dimensions of no less than 1 nm and a largest dimension of no more than 100 micrometres (μm). Where the crystals have one or more dimensions in the range of from 1 nm up to 1000 nm, they may be described as nanocrystals.

Thus, in one aspect the photoactive material of the invention comprises or consists of at least one compound of the invention in powder form. In a further aspect of the invention, the photoactive material comprises or consists of at least one compound of the invention in crystalline form, for instance in polycrystalline form or as nanocrystals.

Typically, the photoactive material comprises one or more compound(s) of the invention in crystalline form, which may be crystalline or polycrystalline. For instance the photoactive material may comprise a plurality of crystallites of one or more of the compounds of the invention. In a preferred embodiment, the invention provides a photoactive material comprising a compound of formula (I) and/or a compound of formula (II) in a crystalline or polycrystalline compound.

The photoactive material is usually a photoemissive material or a photoabsorbent material. A photoemissive material is one which can emit light, typically visible light, particularly blue light (e.g. light having a wavelength of from about 450 to 500 nm, preferably from about 455 to 495 nm, more preferably from about 460 to 490 nm). A photoabsorbent material is one which can emit light, typically visible light, particularly blue light (e.g. light having a wavelength of from about 450 to 500 nm, preferably from about 455 to 495 nm, more preferably from about 460 to 490 nm).

The photoactive material may be in any form. Typically the photoactive material is in the form of a layer. The photoactive material in the form of a layer is typically at least 1 nm thick. The layer of photoactive material may be up to 10 mm thick, for instance where the layer is intended to be a free-standing component of a device. Usually, the layer of photoactive material is from 2 nm to 1 mm thick, more usually from 5 nm to 5 μm thick.

The layer of photoactive material comprises one or more of the compounds of the invention within the said layer. The amount of the compound of the invention within the said layer may vary, depending upon other components in the layer such as any coatings upon crystals of the compound(s) of the invention or matrix or scaffold materials. In some embodiments, the photoactive material may consist essentially of a layer of one or more of the compound(s) of the invention, i.e. one or more of a compound of formula (I), a compound of formula (II) or a mixture as defined herein. For example, the photoactive material may consist entirely of one or more compounds of the invention, e.g. a single compound of the invention. However, more typically, the photoactive material may comprise at least 50% of a compound of the invention by weight, for example at least 70, 80 or 80% of a compound of the invention by weight. In some embodiments, the photoactive material may comprise at least 95%, of a compound of the invention by weight. Typically, a layer of photoactive material according to the invention comprises up to 99.9% of a compound of the invention by weight.

The photoactive material may comprise a plurality of layers. Some or all of such layers may comprise a compound of the invention.

Where a photoactive material in the form of a layer, a compound or compounds of the invention may be distributed evenly or unevenly throughout the layer. For instance, the photoactive material may comprise a layer consisting essentially of, or consisting only of, the compound(s) of the invention, and a coating layer thereon. Alternatively or additionally, the photoactive material may comprise a substrate having a compound or compounds of the invention on the said substrate (for instance in powder form or crystalline form). In other embodiments, the photoactive material may consist only of a layer of a compound or compounds of the invention (for instance in powder or crystalline form).

In some embodiments, the photoactive material may comprise one or more compounds of the invention in the form of a thin film. A thin film typically comprises a polycrystalline material disposed on a substrate.

The photoactive material of the invention may comprise one or more compounds of the invention together with one or more of each of a surface layer or coating.

In some embodiments, for example, the photoactive material of the invention may comprise one or more compounds of the invention together with a passivating agent. Passivating agents are described in published application WO 2015/092397, the entire contents of which is incorporated herein by reference. In these embodiments, the photoactive material comprises a crystalline or polycrystalline material according to the invention, and a passivating agent. The passivating agent is an organic species which can form halogen bonds or chalcogen-metal bonds to under-coordinated moieties in the metal halide perovskite structure, which can lead to a self-assembled layer on a surface of a crystal or crystallite of a compound of the invention.

Exemplary passivating agents are pyrrolidine, piperidine, morpholine, 2H-pyrrole, 2-pyrroline, 3-pyrroline, pyrrole pyridine, napthelene, anthracene, phenanthrene, pyrene, fluoranthene, thiophene, 3-hexylthiophene or tetrahydrothiophene and iodopentafluorobenzene. Thus, in one embodiment, the photoactive material comprises one or more compounds of the invention in crystalline form together with a passivating agent selected from one or more of pyrrolidine, piperidine, morpholine, 2H-pyrrole, 2-pyrroline, 3-pyrroline, pyrrole pyridine, napthelene, anthracene, phenanthrene, pyrene, fluoranthene, thiophene, 3-hexylthiophene or tetrahydro thiophene and iodopentafluorobenzene. The passivating agent is typically present on or at the surface of the crystalline material, and may therefore be described as a surface species.

In some embodiments, the photoactive material may comprise a coating. Typically, the coating may be a protective coating which protects the material(s) of the invention in the photoactive material from environmental factors such as moisture and oxygen.

A coating is compatible with any physical form of the compound(s) of the invention. For instance, a powder may be deposited onto or into a coating; similarly, crystals of a compound of the invention may be individually coated or deposited within a coating. A coating may be present in the form of a layer over a polycrystalline material, or may encompass a polycrystalline material.

Suitable coatings include transparent polymers such as polyethylene (PE), poly (methyl methacrylate) (PMMA), polystyrene (PS), polycarbonate (PC), polyvinyl chloride (PVC), poly (vinylidene fluoride), (PVDF), polyurene (PU), polyvinyl alcohol (PVA), cellulose acetate (CA), acrylonitrile-butadiene-styrene (ABS), polyimide (PEI), and Polydimethylsiloxane. Preferred polymers are polyethylene or polymethylmethacrylate (PMMA). Other suitable coatings include silicones.

In a particularly preferred embodiment, the coating comprises an oxide or a metal or metalloid cation. Preferably, the coating comprises an oxide of a metal or metalloid cation, which oxide has a band gap of 4 eV or more. In a particularly preferred embodiment, the coating comprises an oxide of one or more of Al, Si, Zr, Ga, Mg, Y, Ti, Ni and Zn, preferably Al or Si, most preferably Al.

In a preferred aspect of the invention, the photoactive material of the invention comprises a crystalline or polycrystalline compound of the invention comprising a coating on all or part of the crystalline or polycrystalline material. Particularly preferably, the coating comprises alumina and/or silica; particularly preferably alumina ($Al_2O_3$).

The photoactive material may comprise a plurality of coatings. A coating comprised in a photoactive material may or may not be directly in contact with a compound or compounds of the invention.

In some embodiments, the photoactive material of the invention comprises a matrix material. That is, the photoactive material of the invention may comprise one or more compounds of the invention together with a matrix material.

Where the photoactive material of the invention comprises a matrix material, the photoactive material typically comprises particles of one or more compounds of the invention suspended in one or more matrix materials. By "particles" is meant a powder or crystals (e.g. nanocrystals) of the compounds of the invention. Preferably, where the photoactive material comprises a matrix material, the photoactive material comprises nanocrystals of one or more compounds of the invention suspended in said matrix material.

Suitable matrix materials are described in WO 2017/017441, the entire contents of which is incorporated by reference herein. A matrix material is any suitable material in which a plurality of nanoparticles can be suspended. The matrix material is typically solid. The matrix material is typically non-reactive in that it does not undergo a chemical reaction with the nanoparticles or any other part of the light emitting device (e.g. a metal component). The matrix material typically has a high transparency to light across a large proportion of the visible spectrum.

The matrix material may be an inorganic material or an organic material. The matrix material is usually stable at temperatures up to 150° C. or up to 100° C. Typically, the matrix material comprises a polymeric matrix material.

A polymeric matrix material is a matrix material comprising a polymer. The polymeric matrix material typically comprises a polymer which is a polyalkene (e.g. polyethene, polypropene, polybutene, polymethylmethacrylate or polystyrene), a polyester (e.g. polyethylene terephthalate, polyhydroxybutyrate or polyethylene apidate), a polyurethane, a polycarbonate, a polyimide, a polyamide (e.g. polyamide 6 or polyamide 66), or an epoxy resin. Preferably, the polymeric matrix material comprises a polymer selected from polymethylmethacrylate, polystyrene, polyurethane, a polycarbonate, a polyimide, a polyamide or an epoxy resin.

An inorganic matrix material is typically an inorganic oxide, for example a metal oxide. Examples of inorganic matrix materials include ZnO, NiO and $SnO_2$.

In some embodiments, the matrix material is a semiconducting material. Suitable examples of semiconducting matrix materials include poly vinyl carbazole, a polyfluorene derivative, and CBP (4,4'-Bis(N-carbazolyl)-1,1'-biphenyl).

Thus, in some embodiments, the photoactive material comprises nanoparticles of one or more compounds of the invention together with a matrix material selected from polymethylmethacrylate, polystyrene, polyurethane, a polycarbonate, a polyimide, a polyamide, an epoxy resin, ZnO, NiO and $SnO_2$, poly vinyl carbazole, a polyfluorene derivative, and CBP (4,4'-Bis(N-carbazolyl)-1,1'-biphenyl).

Where the photoactive material comprises a matrix material, the photoactive material typically comprises up to 50% by weight of the matrix material. For example, the photoactive material typically comprises up to 40% by weight, up to 30% by weight or up to 20% by weight of the matrix material. In such embodiments, the photoactive material typically comprises at least 50% by weight of the compound (s) of the invention.

Where the photoactive material comprises a matrix material, the photoactive material is typically present in the form of a layer. The thickness of the said layer is typically from 100 nm to 4 mm, for instance from 1 jam to 1000 jam or from 50 jam to 500 jam. In some cases the layer may have a thickness of from 1 to 4 mm, for instance if a free-standing layer is to be constructed.

In some embodiments, the photoactive material comprises a scaffold material. A scaffold material is typically a solid material. A scaffold material is typically a solid support on which one or more compounds of the invention are distributed.

In some embodiments, the photoactive material of the invention comprises a porous scaffold together with one or more compound(s) of the invention. Typically, the said porous scaffold material is in contact with the said one or more compound(s) of the invention. Suitable examples of a porous scaffold material are described in WO 2013/171518, the entire contents of which is incorporated by reference.

Typically, a compound of the invention is disposed on the surface of the scaffold material. Typically, where the scaffold is a porous scaffold, a compound of the invention is disposed on the surface of the porous scaffold material, so that it is supported on the surfaces of pores within the scaffold. In such embodiments, the compound(s) of the invention are distributed on an internal surface or surfaces of the scaffold material so that the compound(s) of the invention may be said to be distributed within the scaffold material. The compound(s) of the invention in this situation typically act as a light-absorbing, photosensitising materials, as well as charge-transporting materials. A photoactive material comprising a compound of the invention and a scaffold material, e.g. a porous scaffold material, can advantageously rapidly transport charge carriers through the photoactive material.

A scaffold material is typically a dielectric scaffold material or an n-type scaffold material. Preferably, a scaffold material is a porous dielectric scaffold material or a porous n-type scaffold material.

By "dielectric material" is meant an insulating material. A dielectric scaffold material may comprise a material having a band gap greater than or equal to 3.6 eV, or greater than or equal to 4 eV. A dielectric scaffold material is often a dielectric oxide. A dielectric scaffold material typically comprises one or more oxides of aluminium, germanium, zirconium, silicon, yttrium or ytterbium. However, a dielectric scaffold material may comprise one or more of polymethylmethacrylate (PMMA), polystyrene, polycarbonate, or polyimide. A dielectric scaffold material may be preferably be selected from aluminasilicate, zirconia, alumina and silica, for instance alumina ($Al_2O_3$).

An n-type scaffold may be selected from any n-type material described herein, for instance titania ($TiO_2$). By "n-type material" is meant an electron-transporting material.

A suitable n-type material is typically an inorganic material. A suitable n-type inorganic material may be selected from a metal oxide, a metal sulphide, a metal selenide, a metal telluride, a perovskite, amorphous Si, an n-type group IV semiconductor, an n-type group III-V semiconductor, an n-type group II-VI semiconductor, an n-type group I-VII semiconductor, an n-type group IV-VI semiconductor, an n-type group V-VI semiconductor, and an n-type group II-V semiconductor, any of which may be doped or undoped. More typically, the n-type material is selected from a metal oxide, a metal sulphide, a metal selenide, and a metal telluride. The n-type material may comprise an inorganic material selected from oxide of titanium, tin, zinc, niobium, tantalum, tungsten, indium, gallium, neodinium, palladium, or cadmium, or an oxide of a mixture of two or more of said metals. For instance, the n-type material may comprise $TiO_2$, $SnO_2$, ZnO, $Nb_2O_5$, $Ta_2O_5$, $WO_3$, $W_2O_5$, $In_2O_3$, $Ga_2O_3$, $Nd_2O_3$, PbO, or CdO. Other suitable n-type materials that may be employed include sulphides of cadmium, tin, copper, or zinc, including sulphides of a mixture of two or more of said metals. For instance, the sulphide may be $FeS_2$, CdS, ZnS or $Cu_2ZnSnS_4$. The n-type material may for instance comprise a selenide of cadmium, zinc, indium, or gallium or a selenide of a mixture of two or more of said metals; or a telluride of cadmium, zinc, cadmium or tin, or a telluride of a mixture of two or more of said metals. For instance, the selenide may be $Cu(In,Ga)Se_2$. Typically, the telluride is a telluride of cadmium, zinc, cadmium or tin. For instance, the telluride may be CdTe. The n-type material may for instance comprise an inorganic material selected from oxide of titanium, tin, zinc, niobium, tantalum, tungsten, indium, gallium, neodinium, palladium, cadmium, or an oxide of a mixture of two or more of said metals; a sulphide of cadmium, tin, copper, zinc or a sulphide of a mixture of two or more of said metals; a selenide of cadmium, zinc, indium, gallium or a selenide of a mixture of two or more of said metals; or a telluride of cadmium, zinc, cadmium or tin, or a telluride of a mixture of two or more of said metals. Examples of other semiconductors that may be suitable n-type materials, for instance if they are n-doped, include group IV compound semiconductors; amorphous Si; group III-V semiconductors (e.g. gallium arsenide); group II-VI semiconductors (e.g. cadmium selenide); group I-VII semiconductors (e.g. cuprous chloride); group IV-VI semiconductors (e.g. lead selenide); group V-VI semiconductors (e.g. bismuth telluride); and group II-V semiconductors (e.g. cadmium arsenide). Typically, the n-type material comprises $TiO_2$.

Thus, in some embodiments the photoactive material of the invention may comprise a compound of the invention together with a porous scaffold material, preferably wherein the dielectric scaffold material is selected from one or more of alumina, silica and titania.

Where the photoactive material comprises a scaffold material, the photoactive material is typically present in the form of a layer. Typically, the thickness of the said layer is from 100 nm to 1000 nm, for instance the thickness may be from 400 nm to 800 nm. Often, thickness of the said layer is from 400 nm to 700 nm.

A layer of the photoactive material of the invention may be without open porosity. The layer of the photoactive material may comprise a layer of a compound of the invention, which layer of a compound of the invention is without open porosity. Alternatively, the layer of the photoactive material may be porous, or the layer of the photoactive material may be deposited on a porous scaffold as described herein.

Method of Producing Blue Light

The invention further provides a method of producing blue light, the method comprising inducing a perovskite of formula (I), and/or a mixed perovskite of formula (II), and/or a mixture, and/or a photoactive material as described herein, to produce blue light.

Accordingly, the invention provides a method of producing blue light, the method comprising inducing a perovskite of formula (I)

$$[Rb_xCs_{(1-x)}][Pb][Br_yCl_{(1-y)}]_3 \quad (I)$$

wherein x is greater than 0 and less than 1, and y is greater than 0 and less than 1, to emit blue light. Typically, the blue light emitted in this method has a wavelength of less than 500 nm, e.g. from about 450 to 495 nm, preferably from about 455 to 495 nm, more preferably from about 460 to 490, more preferably from 460 to 485 nm, and most preferably from 465 to 480 nm. For instance, the blue light emitted in this method has a peak emission wavelength, for instance a peak photoluminescence emission wavelength, of less than 500 nm, e.g. from about 450 to 495 nm, preferably from about 455 to 495 nm, more preferably from about 460 to 490, more preferably from 460 to 485 nm, and most preferably from 465 to 480 nm.

In the method which inducing a perovskite of formula (I) to emit blue light, x is typically from 0.1 to 0.9 and y is from 0.1 to 0.9. For instance, x and y may each be from 0.2 to 0.8 or from 0.3 to 0.7. In a preferred embodiment, x is from 0.35 to 0.65 and y is from 0.4 to 0.6; for instance, x is from 0.35 to 0.45 and y is from 0.4 to 0.6 or from 0.45 to 0.55.

Similarly, the invention provides a method of producing blue light, the method comprising inducing a mixed perovskite of formula (II)

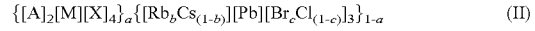

$$\{[A]_2[M][X]_4\}_a\{[Rb_bCs_{(1-b)}][Pb][Br_cCl_{(1-c)}]_3\}_{1-a} \quad (II)$$

wherein

[A] comprises one or more A cations which are organic monocations;

[M] comprises one or more M cations which are metal or metalloid dications;

[X] comprises one or more X anions which are halide anions;

a is greater than 0 and less than 1;

b is from 0 to 1, c is from 0 to 1, and at least one of b and c is greater than 0 and less than 1, to emit blue light.

Typically, in the method which involves inducing a mixed perovskite of formula (II) to emit blue light, the blue light has a wavelength of less than 500 nm. For instance, the blue light may have a wavelength of from about 450 to 495 nm, preferably from 460 to 495 nm, and most preferably from 465 to 490 nm; for example from 470 to 490 nm or 475 to 490 nm. The mixed perovskites of formula (II) may in particular be used to emit light having a peak emission wavelength, for instance a photoluminescence peak emission wavelength, of less than 500 nm, preferably of from 450 to 495 nm, preferably from 460 to 495 nm, and more preferably from 465 to 490 nm; for example from 470 to 490 nm or 475 to 490 nm.

Similarly, the invention provides a method of producing blue light, the method comprising inducing a mixture comprising:

(a) a compound of formula $[A]_2[M][X]_4$, wherein

[A] comprises one or more A cations which are organic monocations;

[M] comprises one or more M cations which are metal or metalloid dications;

[X] comprises one or more X anions which are halide anions;

and (b) a compound of formula $[Rb_bCs_{(1-b)}][Pb][Br_cCl_{(1-c)}]_3$ wherein b is from 0 to 1, c is from 0 to 1, and at least one of b and c is greater than 0 and less than 1, to emit blue light.

Typically, in the method which involves inducing a mixture to emit blue light, the blue light has a wavelength of less than 500 nm. For instance, the blue light may have a wavelength of from about 450 to 495 nm, preferably from 460 to 495 nm, and more preferably from 465 to 490 nm; for example from 470 to 490 nm or 475 to 490 nm. The mixture may in particular be used to emit light having a peak emission wavelength, for instance a photoluminescence peak emission wavelength, of less than 500 nm, preferably of from 450 to 495 nm, preferably from 460 to 495 nm, and more preferably from 465 to 490 nm; for example from 470 to 490 nm or 475 to 490 nm.

The means by which the compound of the invention may be induced to emit blue light in the above-described methods is not particularly limited. Methods by which such materials may be induced to emit light are well-known to the person skilled in the art. By way of example, the method may comprise irradiating the compound of the invention with electromagnetic radiation, for instance with radiation having a wavelength of less than 450 nm. Suitable examples of electromagnetic radiation which may be used to irradiate the compound of the invention in order to induce emission of blue light include UV light and/or X-rays.

Other means by which the compounds of the invention may be induced to emit blue light include electrical means. For instance, the compounds of the invention may be induced to emit blue light by the application of a potential difference or voltage to the compound of the invention, and/or by the causing an electrical charge to flow through the compound of the invention.

Optoelectronic Device

The invention further provides an optoelectronic device comprising a photoactive material as defined herein. Thus, the invention provides an optoelectronic device comprising one or more compound(s) of the invention (that is, a perovskite of formula (I) and/or a mixed perovskite of formula (II) and/or a mixture as defined herein).

The term "optoelectronic device" as used herein, refers to devices which source, control, detect or emit light. Typically, the light is visible light, preferably blue light (i.e. light having a wavelength of about 450 to 495 nm, preferably about 455 to 490 nm, more preferably about 460 to 485 nm). The optoelectronic device of the invention comprises the photoactive material of the invention and is therefore capable of one or more of:

(i) absorbing photons, which may then generate free charge carriers e.g. electrons and holes;

(ii) absorbing photons at energies higher than its band gap and re-emit photons at energies of the band gap; and (iii) accepting charge, both electrons and holes, which may subsequently recombine and emit light.

In one preferred embodiment, the invention provides an optelectronic device which is a photovoltaic device, comprising a photoactive material as defined herein. By "photovoltaic device" is meant herein a device that is capable of converting electrical energy into light, particularly visible light, and preferably blue light (i.e. light having a wavelength of about 450 to 495 nm, preferably about 455 to 490 nm, more preferably about 460 to 485 nm).

In another preferred embodiment, the invention provides an optelectronic device which is a light-emitting device, comprising a photoactive material as defined herein. The light-emitting device may be a light-emitting diode. The light-emitting device of the invention is typically capable of emitting visible light, preferably blue light (i.e. light having a wavelength of about 450 to 495 nm, preferably about 455 to 490 nm, more preferably about 460 to 485 nm).

In some preferred embodiments, the optoelectronic device of the invention comprises a photoactive material, wherein the photoactive material is disposed in a layer. A layer of photoactive material is defined herein. Usually, the said layer of photoactive material has a thickness of at least 2 nm. However, in some embodiments where the layer is intended to stand alone, the layer may be considerably thicker (for example up to 10 mm thick, more usually up to 5 mm thick).

In some embodiments, the optoelectronic device of the invention comprises a layer of photoactive material which is a thin sensitising layer, for instance having a thickness of from 5 nm to 50 nm.

In devices wherein the layer of said photoactive material forms a planar heterojunction with an n-type or p-type region, the layer of said photoactive material may have a thickness of at least 1 nm, for instance at least 10 nm or at least 50 nm, or for example a thickness of greater than or equal to 100 nm. Preferably, the layer of said photoactive material has a thickness of from 100 nm to 700 nm, for instance from 200 nm to 500 nm. The term "planar heterojunction", as used herein, means that surface defining junction between the semiconducting material and the n- or p-type region is substantially planar and has a low roughness, for instance a root mean squared roughness of less than 20 nm over an area of 25 nm by 25 nm, for instance a root mean squared roughness of less than 10 nm, or less than 5 nm, over an area of 25 nm by 25 nm.

The photoactive material often acts as a photoactive component (e.g. a photoabsorbent component or a photoemissive component) within the optoelectronic device. In other embodiments, the semiconducting material may form a layer of a p-type or n-type semiconductor in an optoelectronic device, e.g. a solar cell or an LED.

Typically, the optoelectronic device of the invention (which may be a light-emitting device or a photovoltaic device) comprises:
(a) an n-type region comprising at least one n-type layer;
(b) a p-type region comprising at least one p-type layer; and, disposed between the n-type region and the p-type region:
(c) the layer of the photoactive material.

Preferred examples of the optoelectronic device of the invention (which may be a light-emitting device, or a photovoltaic device) include a light-emitting diode (LED), a photodiode, a solar cell, a photodetector, or a photosensor; particularly preferable are an LED, a photodiode or a solar cell.

For instance, the optoelectronic device may comprise:
an n-type region comprising at least one n-type layer;
a p-type region comprising at least one p-type layer; and, disposed between the n-type region and the p-type region:
said layer of a photoactive material which comprises (or consists essentially of) a layer of a crystalline compound of the invention (e.g. a crystalline compound of formula (I) or formula (II) or a mixture as defined herein).

The n-type region comprises at least one n-type layer. The n-type region typically comprises one or two n-type layers. Each layer may be porous or compact. A compact layer is typically a layer without open porosity (e.g. absent of any meso- or macroporosity). The p-type region comprises at least one p-type layer. The p-type region typically comprises one or two p-type layers. Each layer may be porous or compact. A compact layer is typically a layer without open porosity. The n-type and p-type materials in these layers may be as further defined herein.

In some cases, the optoelectronic device comprises a layer of said photoactive material without open porosity. The layer of said photoactive material without open porosity is typically a crystalline layer of a perovskite or mixed perovskite or a mixture according to the invention without open porosity. Thus, the layer of said photoactive material may comprise greater than or equal to 95 volume % of one or more compounds of the invention (and thus less than 5 volume % of absence pore volume). A layer without open porosity is a layer which typically does not comprise macropores or mesopores.

The layer of the photoactive material typically forms a planar heterojunction with the n-type region or the p-type region. The layer of the photoactive material typically forms a first planar heterojunction with the n-type region and a second planar heterojunction with the p-type region. This forms a planar heterojunction device. The term "planar heterojunction" as used herein refers to a junction between two regions where one region does not infiltrate the other. This does not require that the junction is completely smooth, just that one region does not substantially infiltrate pores in the other region.

When the layer of the photoactive material forms a planar heterojunction with both the p-type and the n-type region, this typically forms a thin film device. The thickness of the layer of the photoactive material may be greater than or equal to 50 nm.

In some embodiments, it is desirable to have a porous scaffold material present, wherein the porous scaffold is as defined herein. The scaffold material may aid charge transport from the photoactive material to an adjacent region. The scaffold material may also, or alternatively, aid formation of the layer of the photoactive material during device construction. Thus, in some embodiments, the optoelectronic device comprises:
an n-type region comprising at least one n-type layer;
a p-type region comprising at least one p-type layer; and, disposed between the n-type region and the p-type region, a layer of photoactive material comprising:
(i) a porous scaffold material; and
(ii) a compound of the invention in contact with the scaffold material.

The architecture of such devices is described in more detail in WO 2014/045021, whose entire contents are incorporated herein by reference.

The layer of photoactive material comprising a porous scaffold material and a compound of the invention may form a sensitizing layer of the photoactive material. Thus, the optoelectronic device may be a sensitized device.

Further details of the architecture of optoelectronic devices such as solar cells and suitable materials therefor are described in published application WO 2017/037448, the entire contents of which is incorporated herein by reference. The compounds of the present invention may be used in place of the semiconducting material therein.

In some embodiments, the optoelectronic device comprises:
an n-type region comprising at least one n-type layer;
a p-type region comprising at least one p-type layer; and, disposed between the n-type region and the p-type region:
(i) a first layer which comprises a porous scaffold material and said compound(s) of the invention; and
(ii) a capping layer disposed on said first layer, which capping layer is a layer of said compound(s) of the invention without open porosity,
wherein the compound(s) of the invention in the capping layer is in contact with the compound(s) of the invention in the first layer.

The first layer comprises said porous scaffold material and said compound(s) of the invention disposed on the surface of the scaffold material. The term "scaffold material" as used herein refers to a material whose function(s) include acting as a physical support for another material. In the present case, the scaffold material acts as a support for the compound(s) of the invention present in the first layer. The compound(s) of the invention is/are disposed, or supported on, the surface of the scaffold material. The porous scaffold material typically has an open porous structure. Accordingly, the "surface" of the porous scaffold material here typically refers to the surfaces of pores within the scaffold material. Thus, the compound(s) of the invention in the first layer is typically disposed on the surfaces of pores within the scaffold material.

In some embodiments, the scaffold material is porous and the compound(s) of the invention in the first layer is disposed in pores of the scaffold material. The effective porosity of said scaffold material is usually at least 50%. For instance, the effective porosity may be about 70%. In one embodiment, the effective porosity is at least 60%, for instance at least 70%.

Typically, the compound(s) of the invention (or photoactive material) in the first layer contacts one of the p-type and n-type regions, and the compound(s) of the invention in the capping layer contacts the other of the p-type and n-type regions. The compound(s) of the invention in the capping layer typically forms a planar heterojunction with the p-type region or the n-type region.

In one embodiment, the compound(s) of the invention in the capping layer contacts the p-type region, and the compound(s) of the invention in the first layer contacts the n-type region. In another embodiment, the compound(s) of the invention in the capping layer contacts the n-type region, and the compound(s) of the invention in the first layer contacts the p-type region (for instance in an inverted device).

In one embodiment, the compound(s) of the invention in the capping layer contacts the p-type region, and the compound(s) of the invention in the first layer contacts the n-type region. Usually, in this embodiment, the scaffold material is either an electron-transporting scaffold material or a dielectric scaffold material. Typically, the compound(s) of the invention in the capping layer forms a planar heterojunction with the p-type region.

In another embodiment, however, the compound(s) of the invention in the capping layer contacts the n-type region, and the compound(s) of the invention in the first layer contacts the p-type region. Typically, in this embodiment, the scaffold material is a hole-transporting scaffold material or a dielectric scaffold material. Typically, the compound(s) of the invention in the capping layer forms a planar heterojunction with the n-type region.

The thickness of the capping layer is usually greater than the thickness of the first layer. The majority of any photoactivity (e.g. light absorption or light emission) therefore usually occurs in a capping layer. The thickness of the capping layer is typically from 10 nm to 100 µm. More typically, the thickness of the capping layer is from 10 nm to 10 µm. Preferably, the thickness of the capping layer is from 50 nm to 1000 nm, or for instance from 100 nm to 700 nm. The thickness of the capping layer may be greater than or equal to 100 nm. The thickness of the first layer, on the other hand, is often from 5 nm to 1000 nm. More typically, it is from 5 nm to 500 nm, or for instance from 30 nm to 200 nm.

The n-type region is typically an n-type layer. The n-type region may alternatively comprise an n-type layer and an n-type exciton blocking layer. Such an n-type exciton blocking layer is typically disposed between the n-type layer and the layer(s) comprising the compound(s) of the invention. The n-type region may have a thickness of from 50 nm to 1000 nm. For instance, the n-type region may have a thickness of from 50 nm to 500 nm, or from 100 nm to 500 nm.

Preferably, the n-type region comprises a compact layer of an n-type semiconductor. The n-type region may further comprise a porous layer of an n-type semiconductor which may be the porous scaffold material as described above (wherein the porous scaffold material is an electron-transporting material).

The n-type region in the optoelectronic device of the invention comprises one or more n-type layers. Often, the n-type region is an n-type layer, i.e. a single n-type layer. In other embodiments, however, the n-type region may comprise an n-type layer and an n-type exciton blocking layer. In cases where an n-type exciton blocking layer is employed, the n-type exciton blocking layer is usually disposed between the n-type layer and the layer(s) comprising the compound(s) of the invention.

An exciton blocking layer is a material which is of wider band gap than the compound(s) of the invention, but has either its conduction band or valance band closely matched with those of the compound(s) of the invention. If the conduction band (or lowest unoccupied molecular orbital energy levels) of the exciton blocking layer are closely aligned with the conduction band of the compound(s) of the invention, then electrons can pass from the compound(s) of the invention into and through the exciton blocking layer, or through the exciton blocking layer and into the compound(s) of the invention, and we term this an n-type exciton blocking layer. An example of such is bathocuproine, as described in P. Peumans, A. Yakimov, and S. R. Forrest, "Small molecular weight organic thin-film photodetectors and solar cells" J. Appl. Phys. 93, 3693 (2001) and Masaya Hirade, and Chihaya Adachi, "Small molecular organic photovoltaic cells with exciton blocking layer at anode interface for improved device performance" Appl. Phys. Lett. 99, 153302 (2011)}.

An n-type layer is a layer of an electron-transporting (i.e. an n-type) material. The n-type material may, for instance, be a single n-type compound or elemental material, which may be undoped or doped with one or more dopant elements.

The n-type layer employed in the optoelectronic device of the invention may comprise an inorganic or an organic n-type material.

A suitable inorganic n-type material may be selected from a metal oxide, a metal sulphide, a metal selenide, a metal telluride, a perovskite, amorphous Si, an n-type group IV semiconductor, an n-type group III-V semiconductor, an n-type group II-VI semiconductor, an n-type group I-VII semiconductor, an n-type group IV-VI semiconductor, an n-type group V-VI semiconductor, and an n-type group II-V semiconductor, any of which may be doped or undoped.

The n-type material may be selected from a metal oxide, a metal sulphide, a metal selenide, a metal telluride, amorphous Si, an n-type group IV semiconductor, an n-type group III-V semiconductor, an n-type group II-VI semiconductor, an n-type group I-VII semiconductor, an n-type group IV-VI semiconductor, an n-type group V-VI semiconductor, and an n-type group II-V semiconductor, any of which may be doped or undoped.

More typically, the n-type material is selected from a metal oxide, a metal sulphide, a metal selenide, and a metal telluride.

Thus, the n-type layer may comprise an inorganic material selected from oxide of titanium, tin, zinc, niobium, tantalum, tungsten, indium, gallium, neodymium, palladium, or cadmium, or an oxide of a mixture of two or more of said metals. For instance, the n-type layer may comprise $TiO_2$, $SnO_2$, $ZnO$, $Nb_2O_5$, $Ta_2O_5$, $WO_3$, $W_2O_5$, $In_2O_3$, $Ga_2O_3$, $Nd_2O_3$, $PbO$, or $CdO$. Other suitable n-type materials that may be employed include sulphides of cadmium, tin, copper, or zinc, including sulphides of a mixture of two or more of said metals. For instance, the sulphide may be $FeS_2$, $CdS$, $ZnS$, $SnS$, $BiS$, $SbS$, or $Cu_2ZnSnS_4$.

The n-type layer may for instance comprise a selenide of cadmium, zinc, indium, or gallium or a selenide of a mixture of two or more of said metals; or a telluride of cadmium, zinc, cadmium or tin, or a telluride of a mixture of two or more of said metals. For instance, the selenide may be $Cu(In,Ga)Se_2$. Typically, the telluride is a telluride of cadmium, zinc, cadmium or tin. For instance, the telluride may be $CdTe$.

The n-type layer may for instance comprise an inorganic material selected from oxide of titanium, tin, zinc, niobium, tantalum, tungsten, indium, gallium, neodymium, palladium, cadmium, or an oxide of a mixture of two or more of said metals; a sulphide of cadmium, tin, copper, zinc or a sulphide of a mixture of two or more of said metals; a selenide of cadmium, zinc, indium, gallium or a selenide of a mixture of two or more of said metals; or a telluride of cadmium, zinc, cadmium or tin, or a telluride of a mixture of two or more of said metals. Examples of other semiconductors that may be suitable n-type materials, for instance if they are n-doped, include group IV elemental or compound semiconductors; amorphous Si; group III-V semiconductors (e.g. gallium arsenide); group II-VI semiconductors (e.g. cadmium selenide); group I-VII semiconductors (e.g. cuprous chloride); group IV-VI semiconductors (e.g. lead selenide); group V-VI semiconductors (e.g. bismuth telluride); and group II-V semiconductors (e.g. cadmium arsenide).

Typically, the n-type layer comprises $TiO_2$.

When the n-type layer is an inorganic material, for instance $TiO_2$ or any of the other materials listed above, it may be a compact layer of said inorganic material. Preferably the n-type layer is a compact layer of $TiO_2$.

Other n-type materials may also be employed, including organic and polymeric electron-transporting materials, and electrolytes. Suitable examples include, but are not limited to a fullerene or a fullerene derivative (for instance $C_{60}$ or Phenyl-C61-butyric acid methyl ester (PCBM)), an organic electron transporting material comprising perylene or a derivative thereof, or poly{[N,N0-bis(2-octyldodecyl)-naphthalene-1,4,5,8-bis(dicarboximide)-2,6-diyl]-alt-5,50-(2,20-bithiophene)} (P(NDI2OD-T2)).

The p-type region is typically a p-type layer. The p-type region may alternatively comprise an p-type layer and a p-type exciton blocking layer. Such a p-type exciton blocking layer is typically disposed between the p-type layer and the layer(s) comprising the compound(s) of the invention. The p-type region may have a thickness of from 50 nm to 1000 nm. For instance, the p-type region may have a thickness of from 50 nm to 500 nm, or from 100 nm to 500 nm.

The p-type region in the optoelectronic device of the invention comprises one or more p-type layers. Often, the p-type region is a p-type layer, i.e. a single p-type layer. In other embodiments, however, the p-type region may comprise a p-type layer and a p-type exciton blocking layer. In cases where a p-type exciton blocking layer is employed, the p-type exciton blocking layer is usually disposed between the p-type layer and the layer(s) comprising the compound (s) of the invention. If the valence band (or highest occupied molecular orbital energy levels) of the exciton blocking layer is closely aligned with the valence band of the compound(s) of the invention, then holes can pass from the compound(s) of the invention into and through the exciton blocking layer, or through the exciton blocking layer and into the compound(s) of the invention, and we term this a p-type exciton blocking layer. An example of such is tris[4-(5-phenylthiophen-2-yl)phenyl]amine, as described in Masaya Hirade, and Chihaya Adachi, "Small molecular organic photovoltaic cells with exciton blocking layer at anode interface for improved device performance" Appl. Phys. Lett. 99, 153302 (2011).

A p-type layer is a layer of a hole-transporting (i.e. a p-type) material. The p-type material may be a single p-type compound or elemental material, or a mixture of two or more p-type compounds or elemental materials, which may be undoped or doped with one or more dopant elements.

The p-type layer employed in the optoelectronic device of the invention may comprise an inorganic or an organic p-type material. Typically, the p-type region comprises a layer of an organic p-type material.

Suitable p-type materials may be selected from polymeric or molecular hole transporters. The p-type layer employed in the optoelectronic device of the invention may for instance comprise spiro-OMeTAD (2,2',7,7'-tetrakis-(N,N-di-p-methoxyphenylamine)9,9'-spirobifluorene)), P3HT (poly(3-hexylthiophene)), PCPDTBT (Poly[2,1,3-benzothiadiazole-4,7-diyl[4,4-bis(2-ethylhexyl)-4H-cyclopenta[2,1-b:3,4-b'] dithiophene-2,6-diyl]]), PVK (poly(N-vinylcarbazole)), HTM-TFSI (1-hexyl-3-methylimidazolium bis(trifhioromethylsulfonyl)imide), Li-TFSI (lithium bis(trifhioromethanesulfonyl)imide) or tBP (tert-butylpyridine). The p-type region may comprise carbon nanotubes. Usually, the p-type material is selected from spiro-OMeTAD, P3HT, PCPDTBT and PVK. Preferably, the p-type layer employed in the optoelectronic device of the invention comprises spiro-OMeTAD.

The p-type layer may for example comprise spiro-OMeTAD (2,2',7,7'-tetrakis-(N,N-di-p-methoxyphenylamine)-9,9'-spirobifluorene)), P3HT (poly(3-hexylthiophene)), PCPDTBT (Poly[2,1,3-benzothiadiazole-4,7-diyl[4,4-bis(2-ethylhexyl)-4H-cyclopenta[2,1-b:3,4-b']dithiophene-2,6-diyl]]), or PVK (poly(N-vinylcarbazole)).

Suitable p-type materials also include molecular hole transporters, polymeric hole transporters and copolymer hole transporters. The p-type material may for instance be a molecular hole transporting material, a polymer or copolymer comprising one or more of the following moieties: thiophenyl, phenelenyl, dithiazolyl, benzothiazolyl, diketopyrrolopyrrolyl, ethoxydithiophenyl, amino, triphenyl amino, carbozolyl, ethylene dioxythiophenyl, dioxythiophenyl, or fluorenyl. Thus, the p-type layer employed in the optoelectronic device of the invention may for instance comprise any of the aforementioned molecular hole transporting materials, polymers or copolymers.

Suitable p-type materials also include m-MTDATA (4,4', 4"-tris(methylphenylphenylamino)triphenylamine), MeOTPD (N,N,N',N'-tetrakis(4-methoxyphenyl)-benzidine), BP2T (5,5'-di(biphenyl-4-yl)-2,2'-bithiophene), Di-NPB (N,N'-Di-[(1-naphthyl)-N,N'-diphenyl]-1,1'-biphenyl)-4,4'-diamine), α-NPB (N,N'-di(naphthalen-1-yl)-N,N'-diphenyl-benzidine), TNATA (4,4',4"-tris-(N-(naphthylen-2-yl)-N-phenylamine)triphenylamine), BPAPF (9,9-bis[4-(N, N-bis-biphenyl-4-yl-amino)phenyl]-9H-fluorene), spiro-NPB (N2,N7-Di-1-naphthalenyl-N2,N7-diphenyl-9,9'-spirobi[9H-fluorene]-2,7-diamine), 4P-TPD (4,4-bis-(N,N-diphenylamino)-tetraphenyl), PEDOT:PSS and spiro-OMeTAD.

The p-type layer may be doped, for instance with tertbutyl pyridine and LiTFSI. The p-type layer may be doped to increase the hole-density. The p-type layer may for instance be doped with $NOBF_4$ (Nitrosonium tetrafluoroborate), to increase the hole-density.

In other embodiments, the p-type layer may comprise an inorganic hole transporter. For instance, the p-type layer may comprise an inorganic hole transporter comprising an oxide of nickel, vanadium, copper or molybdenum; CuI, CuBr, CuSCN, $Cu_2O$, CuO or CIS; a perovskite; amorphous Si; a p-type group IV semiconductor, a p-type group III-V semiconductor, a p-type group II-VI semiconductor, a p-type group I-VII semiconductor, a p-type group IV-VI semiconductor, a p-type group V-VI semiconductor, and a p-type group II-V semiconductor, which inorganic material may be doped or undoped. The p-type layer may be a compact layer of said inorganic hole transporter.

The p-type layer may for instance comprise an inorganic hole transporter comprising an oxide of nickel, vanadium, copper or molybdenum; CuI, CuBr, CuSCN, Cu$_2$O, CuO or CIS; amorphous Si; a p-type group IV semiconductor, a p-type group III-V semiconductor, a p-type group II-VI semiconductor, a p-type group I-VII semiconductor, a p-type group IV-VI semiconductor, a p-type group V-VI semiconductor, and a p-type group II-V semiconductor, which inorganic material may be doped or undoped. The p-type layer may for instance comprise an inorganic hole transporter selected from CuI, CuBr, CuSCN, Cu$_2$O, CuO and CIS. The p-type layer may be a compact layer of said inorganic hole transporter.

Typically, the p-type layer comprises a polymeric or molecular hole transporter, and the n-type layer comprises an inorganic n-type material. The p-type polymeric or molecular hole transporter may be any suitable polymeric or molecular hole transporter, for instance any of those listed above. Likewise, the inorganic n-type material may be any suitable n-type inorganic, for instance any of those listed above. In one embodiment, for instance, the p-type layer comprises spiro-OMeTAD and the n-type layer comprises TiO$_2$. Typically, in that embodiment, the n-type layer which comprises TiO$_2$ is a compact layer of TiO$_2$.

In other embodiments, both the n-type layer and the p-type layer comprise inorganic materials. Thus, the n-type layer may comprise an inorganic n-type material and the p-type layer may comprise an inorganic p-type material. The inorganic p-type material may be any suitable p-type inorganic, for instance any of those listed above. Likewise, the inorganic n-type material may be any suitable n-type inorganic, for instance any of those listed above.

In other embodiments, the p-type layer comprises an inorganic p-type material (i.e. an inorganic hole transporter) and the n-type layer comprises a polymeric or molecular hole transporter. The inorganic p-type material may be any suitable p-type inorganic, for instance any of those listed above. Likewise, the n-type polymeric or molecular hole transporter may be any suitable n-type polymeric or molecular hole transporter, for instance any of those listed above.

For instance, the p-type layer may comprise an inorganic hole transporter and the n-type layer may comprise an electron transporting material, wherein the electron transporting material comprises a fullerene or a fullerene derivative, an electrolyte, or an organic electron transporting material, preferably wherein the organic electron transporting material comprises perylene or a derivative thereof, or poly{[N,N0-bis(2-octyldodecyl)-naphthalene-1,4,5,8-bis(dicarboximide)-2,6-diyl]-alt-5,50-(2,20-bithiophene)} (P(NDI20D-T2)). The inorganic hole transporter may for instance comprise an oxide of nickel, vanadium, copper or molybdenum; CuI, CuBr, CuSCN, Cu$_2$O, CuO or CIS; a perovskite; amorphous Si; a p-type group IV semiconductor, a p-type group III-V semiconductor, a p-type group II-VI semiconductor, a p-type group I-VII semiconductor, a p-type group IV-VI semiconductor, a p-type group V-VI semiconductor, and a p-type group II-V semiconductor, which inorganic material may be doped or undoped. More typically, the inorganic hole transporter comprises an oxide of nickel, vanadium, copper or molybdenum; CuI, CuBr, CuSCN, Cu$_2$O, CuO or CIS; a p-type group IV semiconductor, a p-type group III-V semiconductor, a p-type group II-VI semiconductor, a p-type group I-VII semiconductor, a p-type group IV-VI semiconductor, a p-type group V-VI semiconductor, and a p-type group II-V semiconductor, which inorganic material may be doped or undoped. Thus, the inorganic hole transporter may comprise an oxide of nickel, vanadium, copper or molybdenum; CuI, CuBr, CuSCN, Cu$_2$O, CuO or CIS.

The optoelectronic device typically further comprises one or more first electrodes and one or more second electrodes. The one or more first electrodes are typically in contact with the n-type region, if such a region is present. The one or more second electrodes are typically in contact with the p-type region, if such a region is present. Typically: the one or more first electrodes are in contact with the n-type region and the one or more second electrodes are in contact with the p-type region; or the one or more first electrodes are in contact with the p-type region and the one or more second electrodes are in contact with the n-type region. The first and second electrode may comprise any suitable electrically conductive material. The first electrode typically comprises a transparent conducting oxide. The second electrode typically comprises one or more metals. Typically, the first electrode typically comprises a transparent conducting oxide and the second electrode typically comprises one or more metals.

The transparent conducting oxide may be as defined above and is often FTO, ITO, or AZO, and typically ITO. The metal may be any metal. Generally the second electrode comprises a metal selected from silver, gold, copper, aluminium, platinum, palladium, or tungsten. The electrodes may form a single layer or may be patterned.

An optoelectronic device according to the invention, for instance a light emitting device, or a photovoltaic device such as a sensitized solar cell, may comprise the following layers in the following order:

I. one or more first electrodes as defined herein;
II. optionally a compact n-type layer as defined herein;
III. a porous layer of an n-type material as defined herein;
IV. a layer of said compound(s) of the invention (e.g. as a sensitizer);
V. a p-type region as defined herein;
VI. optionally a further compact p-type layer as defined herein; and
VII. one or more second electrodes as defined herein.

An optoelectronic device according to the invention, which may be a light emitting device, or a photovoltaic device, may comprise the following layers in the following order:

I. one or more first electrodes as defined herein;
II. an n-type region comprising at least one n-type layer as defined herein;
III. a layer of the photoactive material comprising the compound(s) of the invention as defined herein;
IV. a p-type region comprising at least one p-type layer as defined herein; and
V. one or more second electrodes as defined herein.

An optoelectronic device according to the invention, which may be a light emitting device, or a photovoltaic device, may comprise the following layers in the following order:

I. one or more first electrodes which comprise a transparent conducting oxide, preferably FTO;
II. an n-type region comprising at least one n-type layer as defined herein;
III. a layer of the compound(s) of the invention as defined herein;
IV. a p-type region comprising at least one p-type layer as defined herein; and
V. one or more second electrodes which comprise a metal, preferably silver or gold.

An optoelectronic device according to the invention, which may be a light emitting device, or a photovoltaic device (for instance an inverted device), may comprise the following layers in the following order:
I. one or more second electrodes as defined herein;
II. an n-type region comprising at least one n-type layer as defined herein;
III. a layer of the compound(s) of the invention as defined herein;
IV. a p-type region comprising at least one p-type layer as defined herein; and
V. one or more first electrodes as defined herein.

An optoelectronic device according to the invention, which may be a light emitting device, or a photovoltaic device (for instance a sensitized solar cell), may comprise the following layers in the following order
I. one or more second electrodes which comprises a metal;
II. an n-type region comprising at least one mesoporous n-type layer as defined herein;
III. a sensitising layer of the compound(s) of the invention as defined herein;
IV. a p-type region comprising at least one p-type layer as defined herein; and
V. one or more first electrodes which comprise a transparent conducting oxide.

The one or more first electrodes may have a thickness of from 100 nm to 700 nm, for instance of from 100 nm to 400 nm. The one or more second electrodes may have a thickness of from 10 nm to 500 nm, for instance from 50 nm to 200 nm or from 10 nm to 50 nm. The n-type region may have a thickness of from 50 nm to 500 nm. The p-type region may have a thickness of from 50 nm to 500 nm.

In other embodiments, the photoactive material functions as a phosphor in the optoelectronic device. In such embodiments, the optoelectronic device typically comprises a light source and a photoactive material as defined herein. The photoactive material may comprise a compound of the invention in crystalline or powder form. Typically, the photoactive material comprises a compound of the invention in powder form or nanocrystalline form. Also typically, the photoactive material comprises a matrix material as defined herein.

By "functions as a phosphor" is meant that the photoactive material functions by absorbing a first wavelength of light and subsequently re-emitting a different, larger wavelength of light.

The light source is typically a white, blue or UV light source. That is, the light source is typically a source of electromagnetic radiation which emits at wavelengths of 500 nm or less, more usually 480 nm or less. For example, the light source typically emits electromagnetic radiation with a wavelength of from 400 to 480 nm.

Examples of optoelectronic devices wherein the photoactive material functions as a phosphor include light-emitting devices, such as display screens, for instance LED display screens, and solid-state lighting devices. Such devices represent a further aspect of the invention.

Uses of Photoactive Materials

In a further aspect, the invention provides uses of the compounds of the invention and the photoactive materials of the invention comprising said compounds.

In a first embodiment, the invention provides the use of a photoactive material as defined herein as a photo-emitter, preferably a photo-emitter which emits light in the wavelength range 450 to 500 nm, preferably 450 to 495 nm, more preferably 455 to 495 nm, further preferably 460 to 490 nm.

Where the photoactive material as described herein comprises a perovskite of formula (I), the photoactive material is typically used to emit light having a wavelength of from about 450 to 495 nm, preferably from about 455 to 495 nm, more preferably from about 460 to 490, more preferably from 460 to 485 nm, and most preferably from 465 to 480 nm. In this case, the photoactive material may in particular be used to emit light having a peak emission wavelength, for instance a peak photoluminescence emission wavelength, of from about 450 to 495 nm, preferably from about 455 to 495 nm, more preferably from about 460 to 490, more preferably from 460 to 485 nm, and most preferably from 465 to 480 nm.

Where the photoactive material as described herein comprises a mixed perovskite of formula (II), or a mixture, the photoactive material is typically used to emit light having a wavelength of from about 450 to 495 nm, preferably from 460 to 495 nm, and more preferably from 465 to 490 nm; for example from 470 to 490 nm or 475 to 490 nm. In this case, the photoactive material may in particular be used to emit light having a peak emission wavelength, for instance a photoluminescence peak emission wavelength, of from 450 to 495 nm, preferably from 460 to 495 nm, and more preferably from 465 to 490 nm; for example from 470 to 490 nm or 475 to 490 nm.

In a second embodiment, the invention provides the use of a photoactive material as defined herein in the manufacture of an optoelectronic device, preferably wherein said optoelectronic device emits light in the wavelength range 450 to 500 nm, more preferably 455 to 495 nm, further preferably 460 to 490 nm.

In a third embodiment, the invention provides the use of a photoactive material as defined herein as a phosphor. For example, the invention provides the use of a photoactive material as defined herein in the manufacture of a screen, in particular an LED screen, or a solid-state lighting device.

In a fourth embodiment, the invention further provides the use of an optoelectronic device as defined herein in a method of generating light, preferably in a method of generating light in the wavelength range 450 to 500 nm, more preferably 455 to 495 nm, further preferably 460 to 490 nm. For example, the invention provides a method of generating light comprising irradiating a photoactive material as defined herein with a light source; and thus generating emission of light from said photoactive material in the wavelength range 450 to 500 nm, more preferably 455 to 495 nm, further preferably 460 to 490 nm.

Methods of Manufacture

The compounds, photoactive materials and optoelectronic devices of the invention can be manufactured using techniques that are well known in the art. Particular examples of such methods, which are envisaged herein as a part of the invention, are described in, for example, WO 2017/037448, WO 2017/017441 and WO 2015/092397WO, the entire contents of which are incorporated herein by reference.

For example, the compounds of the invention may be produced by vapour deposition. Such a method comprises producing the vapour in the first place by evaporating either a compound of the invention, or a plurality of precursor compounds which are capable of producing a compound of the invention. In this step the compound of the invention, or the said plurality of precursor compounds, are typically transferred to an evaporation chamber which is subsequently evacuated. The compound of the invention, or the said plurality of precursor compounds, are typically then heated to produce a resulting vapour.

By "precursor compounds which are capable of producing a compound of the invention" is meant reactants which, when contacted under suitable conditions (such as at a suitable temperature, e.g. 300 K, in vapour or dissolved form), will produce a compound of the invention.

The resulting vapour is then exposed to and thereby deposited on a surface. This surface may for example be a surface on or within an optelectronic device, a substrate (such as a glass substrate) or a scaffold. A solid layer of the compound of the invention is thus produced on the said surface. If precursor compounds are used, these may react together in situ to produce the compound of the invention on the said surface.

Typically, the vapour deposition is allowed to continue until a layer of the compound of the invention has formed with a desired thickness, for instance a thickness of from 1 nm to 100 μm, or more typically from 2 nm to 10 μm.

The compound of the invention produced by the above-described vapour deposition method may or may not be subject to additional processing steps in order to produce a photoactive material of the invention.

In another exemplary method, the compound of the invention may be produced by solution processing. Such a method usually comprises:

(i) disposing one or more solutions on a surface, said one or more solutions comprising one or more solvents and either the compound of the invention, or a plurality of precursor compounds which are capable of producing a compound of the invention; and (ii) removing the one or more solvents to produce a compound of the invention on the said surface.

The one or more solvents may be any suitable solvents. Typically the one or more solvents are selected from polar solvents. Examples of polar solvents include water, alcohol solvents (such as methanol, ethanol, n-propanol, isopropanol and n-butanol), ether solvents (such as dimethylether, diethylether and tetrahydrofuran), ester solvents (such as ethyl acetate), carboxylic acid solvents (such as formic acid and ethanoic acid), ketone solvents (such as acetone), amide solvents (such as dimethylformamide and diethylformamide), amine solvents (such as triethylamine), nitrile solvents (such as acetonitrile), sulfoxide solvents (dimethylsulfoxide) and halogenated solvents (such as dichloromethane, chloroform, and chlorobenzene). The one or more solvents may be selected from polar aprotic solvents. Examples of protic apolar solvents include dimethylformamide (DMF), acetonitrile and dimethylsulfoxide (DMSO).

Usually, the steps of (i) disposing the one or more solvents on a surface, and (ii) removing the solvent, comprise spin-coating or slot-dye-coating the solvent or solvents onto the surface, to produce on the surface a layer of the compound of the invention. Said coating may be carried out in an inert atmosphere, for instance under nitrogen, or it may be carried out in air. The spin-coating is usually performed at a speed of from 1000 to 3000 rpm. The spin coating is typically carried out for 30 seconds to 2 minutes.

The said solutions are typically produced by dissolving powder of the compound of the invention, or powder of the said precursor compounds, in one or more polar solvents. The steps of disposing the said solution or solutions on a surface and removing the solvent or solvents may be carried out until a layer of the compound of the invention is produced with a desired thickness, for instance a thickness of from 1 nm to 100 μm, more typically from 2 nm to 10 μm.

Removing the one or more solvents typically comprises heating the one or more solvents or allowing the one or more solvents to evaporate. The surface, solvent or first region may be heated at a temperature of from 40° C. to 100° C. for a time of from 5 minutes to 2 hours to remove the one or more solvents.

The compound of the invention produced by the above exemplary solution processing method may or may not be subject to further processing steps to produce the photoactive material of the invention.

In a first preferred method, the precursor compounds which are capable of producing a compound of the invention are contacted, either in the solution phase or in the gas phase, in the presence of an oxide precursor and water. The water typically need only be present in small amounts, for instance trace amounts, and atmospheric moisture may, for example, be relied on. An oxide precursor is a compound or group of compounds comprising one or more elements Z which are capable of reacting with water to produce an oxide of the one or more elements Z, wherein the oxide has a band gap of at least 3 eV. Exemplary oxide precursors are compounds of formula $ZR_n$; wherein n is an integer of from 1 to 6 and each R is independently selected from optionally substituted $C_{1-10}$ alkyl, $C_{2-10}$ alkenyl, $C_{3-10}$ cycloalkyl, $C_{1-10}$ alkyloxy, $C_{2-10}$ alkenyloxy, hydride, and halide; preferably unsubstituted substituted $C_{1-10}$ alkyl, $C_{2-10}$ alkenyl, $C_{3-10}$ cycloalkyl, $C_{1-10}$ alkyloxy, $C_{2-10}$ alkenyloxy, hydride, and halide. Particularly Exemplary oxide precursors are organometallic compounds of formula $ZR_n$ wherein n is an integer of from 2 to 4 and each R is independently selected from unsubstituted $C_{1-6}$ alkyl and $C_{1-6}$ alkyloxy; preferably R is methyl and n is 3.

In another preferred method, the compounds of the invention may be produced by contacting an aqueous solution with an organic solution and allowing a precipitate to form when the said aqueous organic solutions are contacted. The aqueous solution comprises each of the A cations present in the compound of the invention, and an aqueous solvent. For instance, where the compound of the invention is a perovskite of formula (I), the aqueous solution comprises $Cs^+$ and $Rb^+$. Where the compound is a mixture or a mixed perovskite of formula (II), the aqueous solvent comprises at least one of $Cs^+$ and $Rb^+$ and, if different, the additional cations present in [A], The organic solution comprises $Pb^{2+}$, and, where the compound is a mixture or a mixed perovskite of formula (II), the organic solution also comprises any M cations present in [M], Preferably, a thin film of a compound of the invention obtained by this method may be formed from the precipitate. The said thin film may be formed by optionally washing the precipitate; dissolving the precipitate in an organic solvent to form a film-forming solution and dispersing the film-forming solution on a substrate; and removing the organic solvent. Alternatively, the said thin film may be formed by optionally washing the precipitate; vapourising the precipitate; and disposing the vapourised precipitate on a substrate.

The photoactive material of the invention may be directly produced by the above methods. For example, the compounds of the invention may be directly deposited with a matrix material (as described in WO 2017/017441), or on a scaffold, or on a part of an optoelectronic device, such that no further processing is required.

However, the photoactive material may be subject to further processing steps. For instance, in a further processing step, a coating may be provided upon the compound of the invention (typically upon the crystalline compound of the invention). An example of such a coating is a protective coating such as a metal oxide coating, for instance an alumina coating. Silica and aluminosilica coatings are also envisaged. Such coatings may be produced by, for instance, vapour deposition.

In some embodiments, in a further processing step, the process by which a photoactive material is produced further comprises providing a surface species upon crystals or crystallites of a compound of the invention. An example of a surface species is an organic passivating agent. Methods for depositing a passivating agent upon a perovskite are described in WO 2015/092397 (the entire contents of which is incorporated herein by reference).

As regards the production of an electronic device, the photoactive material is generally produced in situ. That is, the production of the photoactive material of the invention is typically a step within the production of an optoelectronic device. For instance, where the device is a thin film device, the photoactive material of the invention is generated in situ, upon another layer of the device. However, in some embodiments, a process for producing an optoelectronic device of the comprises a step of incorporating a photoactive material according to the invention into the device.

EXAMPLES

1. Materials

CsBr (99.9%), CsCl (99.9%), RbBr (99.9%), RbCl (99.9%), $PbBr_2$ (≥98%), $PbCl_2$ (≥98%), $PbI_2$ (≥98%), HBr acid (48 wt % in water), N,N-dimethylformamide (DMF), anhydrous dimethyl sulfoxide (DMSO), chlorobenzene (anhydrous 99.8%), toluene (anhydrous 99.8%), and methyl acetate (anhydrous 99.5%) were purchased from Sigma-Ardrich. CsI (99.9%) was purchased from Alfa-Aesar. Ethyl ammonium bromide (EABr), Butyl ammonium bromide (BABr) and Phenethylammonium bromide (PEABr) were synthesised by following method.

1.3 M of amine and 30 mL of ethanol (anhydrous 99.5%) were mixed and stirred in a 250 mL 3-neck flask in an ice-water bath. Then, 10 mL of HBr aqueous solution was slowly added into the mixture. The mixture was stirred for 30-60 min at 0° C. maintained with an ice-water bath. The reacted solution was evaporated by a rotary evaporator at 55-60° C. to remove the solvent, and white precipitate was formed. The white precipitate was then washed with diethyl ether and collected by vacuum filtration, a step which was repeated three times. After filtration, the obtained brominated amine white powder was collected and dried in a vacuum oven at 60° C. overnight. After that, brominated amine was dissolved into ethanol and diethyl ether to make a supersaturated solution. The solution was put in freezer overnight. The white precipitate was then washed with diethyl ether and collected by vacuum filtration, a step which was repeated three times. After filtration, the obtained brominated amine white powder was collected and dried in a vacuum oven at 60° C. overnight.

2. Fabrication of $CsPb(Br_{1-x}Cl_x)_3$ Precursor Solution $CsPb(Br_{1-x}Cl_x)_3$ was prepared by combining differing molar ratios of CsBr and CsCl with $PbBr_2$ and $PbCl_2$. The molar ratio of Cs:Pb was maintained at 2:1. The halide salts were dissolved in a mixed solvent of DMF and DMSO in 1:9 volume ratio to obtain a perovskite solution with desired composition and 0.1 M of lead halide concentration and the solution was mixed with magnetic stir bar at 40° C. for more than 30 min. The solution was filtered with PTFE Filter (pore size 0.45 μm).

3. Fabrication of $Cs_{1-x}Rb_xPb(Br_{1-x}Cl_x)_3$ Precursor Solution $Cs_{1-x}Rb_xPb(Br_{1-x}Cl_x)_3$ was prepared by mixing of $CsPb(Br_{1-x}Cl_x)_3$ and $RbPb(Br_{1-x}Cl_x)_3$ precursor solutions. $CsPb(Br_{1-x}Cl_x)_3$ was prepared as in (2), by combining differing molar ratios of CsBr and CsCl with differing molar ratios of $PbBr_2$ and $PbCl_2$, while maintaining a 2:1 molar ratio of Cs:Pb. $RbPb(Br_{1-x}Cl_x)_3$ was prepared by combining differing molar ratios of RbBr and RbCl with differing molar ratios $PbBr_2$ and $PbCl_2$ while maintaining a 2:1 molar ratio of Rb:Pb. The halide salts were dissolved in a mixed solvent of DMF and DMSO in 1:9 volume ratio to obtain a perovskite solution with desired composition, having a lead halide concentration of 0.1 M. The solution was mixed with magnetic stir bar at 40° C. for more than 30 min. The solution was filtered with PTFE Filter (pore size 0.45 μm).

4. Fabrication of $("A")_2PbX_4$ Mixed Precursor Solution $("A")_2PbX_4$ precursor solution was prepared by combining "A" Br with $PbBr_2$ or $PbCl_2$ while maintaining a 2:1 molar ratio of "A":Pb. The solvent was a mixed solvent of DMF and DMSO in 1:9 volume ratio. A perovskite solution was thus obtained, having the desired molar composition and a lead halide concentration of 0.1 M. The solution was mixed with a magnetic stir bar at 40° C. for more than 30 min. The solution was filtered with PTFE Filter (pore size 0.45 μm).

A precursor solution comprising $("A")_2PbX_4$ precursor compounds together with a perovskite precursor solution as described in point 2 or 3 was prepared by changing the relative amounts of the $("A")_2PbX_4$ precursor solution and the perovskite precursor solution present.

5. Fabrication of Thin Films

The perovskite precursor solution was coated onto the glass substrate by a spin-coating process at 3000 rpm (acceleration 500 rpm) for 50 sec in the normal lab atmosphere (18-20° C., humidity 40-60%), and then the perovskite films were annealed at 100° C. for 5 min in the same dried atmosphere.

In an alternative solvent quenching method, 80 μL of the precursor solution was spin-coated per substrate, spinning for 30 s at 3000 rpm (acceleration 500 rpm) 10 s before the end of the spin-coating program, the spinning substrate was quenched with 200 μL anti-solvent. Thereafter, the perovskite films were annealed at 100° C. for 5 min in the same dried atmosphere.

All thin film samples were coated with Poly(methyl methacrylate) (PMMA, 20 mg/mL in chlorobenzene) to protect from air moisture.

6. Characterization

UV-vis absorption spectra were measured by a commercial spectrophotometer (Varian Cary 300 UV-Vis, USA). Photoluminescence (PL) spectra were recorded using an excitation wavelength of 365 nm and slit widths of 3 mm on a commercial spectrofluorometer (Horiba, Fluorolog). Photo luminescence quantum yield (PLQY) values were determined using a 405 nm CW laser (RLTMDL-405, Roithner Lasertechnik GmbH) to illuminate a sample in an integrating sphere (Oriel Instruments 70682NS), and the laser scatter and PL collected using a fiber-coupled detector (Ocean Optics MayaPro). PLQY calculations were carried out using established techniques. The laser intensity was adjusted using optical density filters.

7. Results

The above methods were used to make and characterise various compounds of the invention, together with a number of comparative species. The results of these experiments are shown in the attached Figures and the Tables below.

Table 1 provides a summary of the photo luminescence properties of various $CsPb(Br_{1-x}Cl_x)_3$ thin films prepared according to the invention. In particular, it can be seen that the photoluminescence quantum yield, PLQY, decreases as the amount of chloride present decreases. The relevant emission spectra are shown in FIG. 1(b), and the absorption spectra in FIG. 1(a). "PL peak position" indicates the wavelength at with the peak of the photoluminescence spectrum is found. This is also termed the photoluminescence peak emission wavelength.

TABLE 1

| $CsPb(Br_{1-x}Cl_x)_3$ x = | PL peak position (nm) | FWHM (nm) | PLQY (%) |
|---|---|---|---|
| 0 | 527 | 24.5 | 6.52 ± 0.42 |
| 0.4 | 488 | 34.5 | 4.93 ± 1.48 |
| 0.5 | 482 | 22.4 | 3.33 ± 0.75 |
| 0.6 | 466 | 27.0 | 3.11 ± 0.60 |
| 0.7 | 467 | 23.5 | 1.02 ± 0.22 |

Table 2 provides a summary of the photo luminescence properties on the perovskite thin films fabricated from $CPb(Br_{0.5}Cl_{0.5})_3$ mixed with different concentration of (top) $(BA)_2PbBr_4$ and (bottom) $(BA)_2PbBr_2Cl_2$. BA indicates the butylammonium cation. The relevant emission spectra are shown in FIGS. 2(b) and (d), and the absorption spectra are shown in FIGS. 2(a) and (c). Surprising increases in PLQY are observed as the emission wavelength shifts to the blue region of the spectrum.

TABLE 2

| $(CsPb(Br_{0.5}Cl_{0.5})_3)_{1-x}$ $((BA)_2PbBr_4)_x$ X = | PL peak position (nm) | FWHM (nm) | PLQY (%) |
|---|---|---|---|
| 0 | 482 | 22.4 | 3.33 ± 0.75 |
| 0.05 | 488 | 20.9 | 9.39 ± 1.12 |
| 0.1 | 479 | 19.0 | 4.68 ± 0.53 |
| 0.3 | 476 | 28.6 | 3.91 ± 0.58 |

| $(CsPb(Br_{0.5}Cl_{0.5})_3)_{1-x}$ $((BA)_2PbBr_2Cl_2)_x$ X = | PL peak position (nm) | FWHM (nm) | PLQY (%) |
|---|---|---|---|
| 0 | 482 | 22.4 | 3.33 ± 0.75 |
| 0.05 | 480 | 21.4 | 5.73 ± 0.36 |
| 0.1 | 479 | 24.7 | 6.72 ± 0.90 |
| 0.3 | 476 | 24.7 | 0.56 ± 0.05 |

Figure 3:
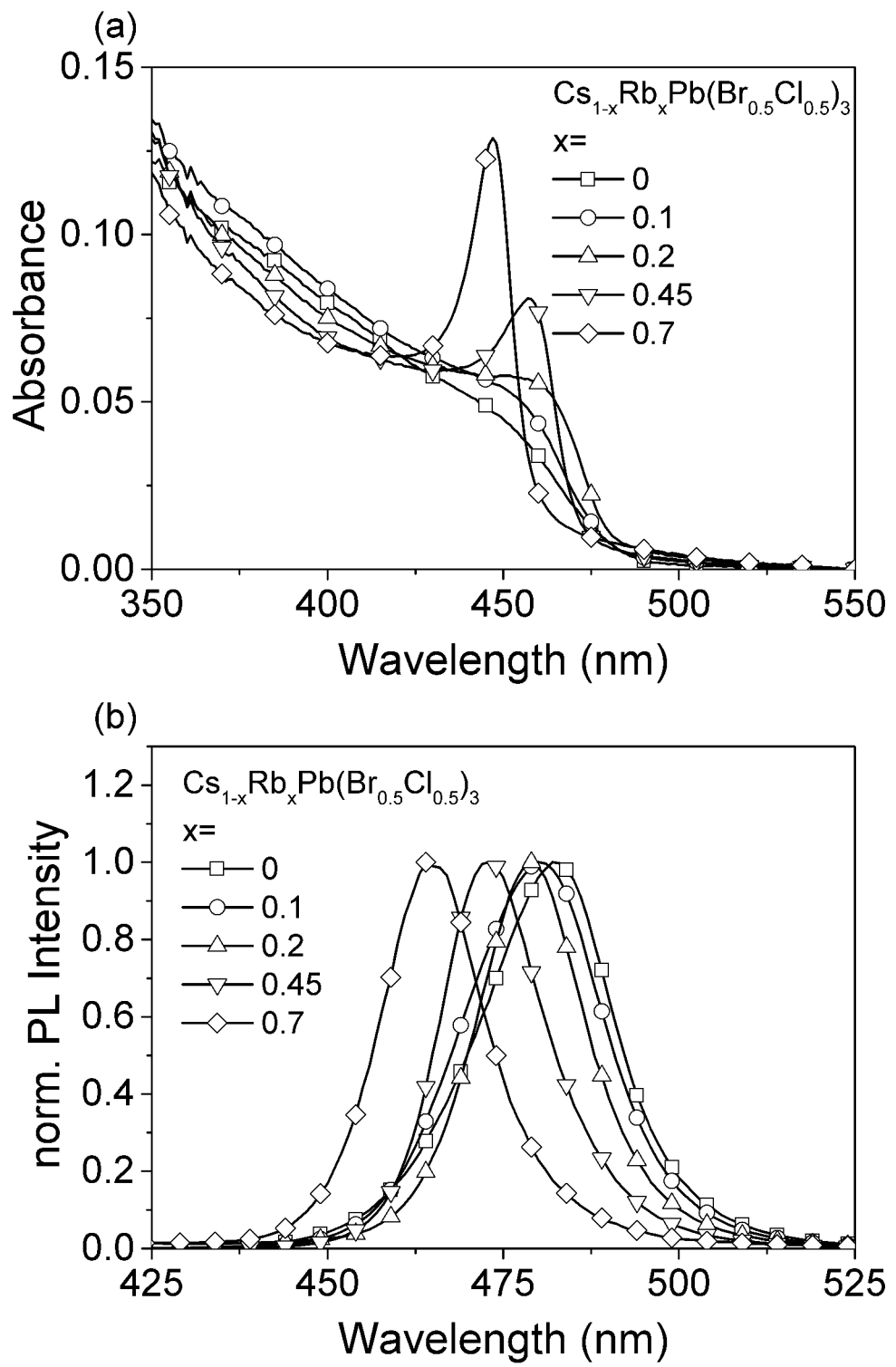
FIG. 3: (a) absorption spectra, and (b) normalised steady-state photoluminescence spectra of $Cs_{1-x}Rb_xPb(Br_{0.5}Cl_{0.5})_3$ thin films.

Table 3 summarises the photoluminescence properties of the $Cs_{1-x}Rb_xPb(Br_{0.5}Cl_{0.5})_3$ thin films according to the invention. Good PLQY is observed even as the emission spectrum moves into the blue region of the spectrum. The accompanying absorbance and emission spectra are shown in FIG. 3.

TABLE 3

| $Cs_{1-x}Rb_xPb(Br_{0.5}Cl_{0.5})_3$ X = | PL peak position (nm) | FWHM (nm) | PLQY (%) |
|---|---|---|---|
| 0 | 482 | 22.4 | 3.33 ± 0.75 |
| 0.1 | 480 | 23.2 | 2.35 ± 0.28 |
| 0.2 | 479 | 18.1 | 5.98 ± 1.08 |
| 0.3 | 476 | 16.7 | 4.40 ± 0.50 |
| 0.45 | 473 | 17.7 | 3.21 ± 0.68 |
| 0.7 | 464 | 17.6 | 0.05 ± 0.10 |

Figure 4:
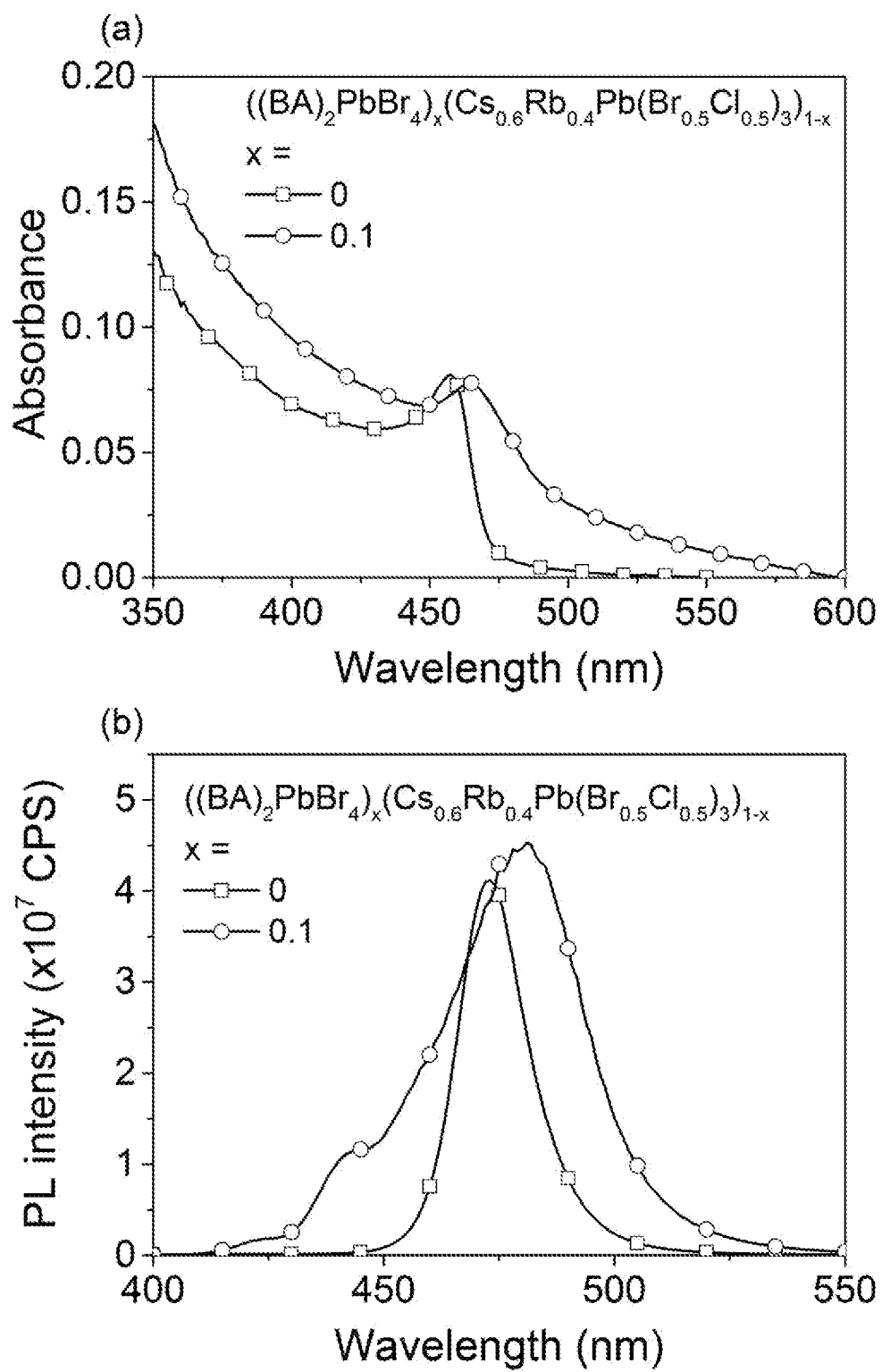
FIG. 4: (a) absorption spectra, and (b) normalised steady-state photoluminescence spectra of $Cs_{0.6}Rb_{0.4}Pb(Br_{0.5}Cl_{0.5})_3$ thin films with and without $(BA)_2PbBr_4$.

Table 4 summarises the photoluminescence properties of the $Cs_{0.6}Rb_{0.4}Pb(Br_{0.5}Cl_{0.5})_3$ thin films with and without $(BA)_2PbBr_4$ present. The relevant absorbance and emission spectra are shown in FIG. 4. Particular attention should be paid to FIG. 4(b), which shows that although the PL peak position is at 480 nm, there is strong emission occurring far in to the blue, even at 450 nm.

TABLE 4

| $(Cs_{0.55}Rb_{0.45}Pb(Br_{0.5}Cl_{0.5})_3)_{1-x}$ $((BA)_2PbBr_4)_x$ X = | PL peak position (nm) | FWHM (nm) | PLQY (%) |
|---|---|---|---|
| 0 | 473 | 17.7 | 3.21 ± 0.68 |
| 0.1 | 480 | 35.0 | 7.03 ± 0.67 |

Figure 5:
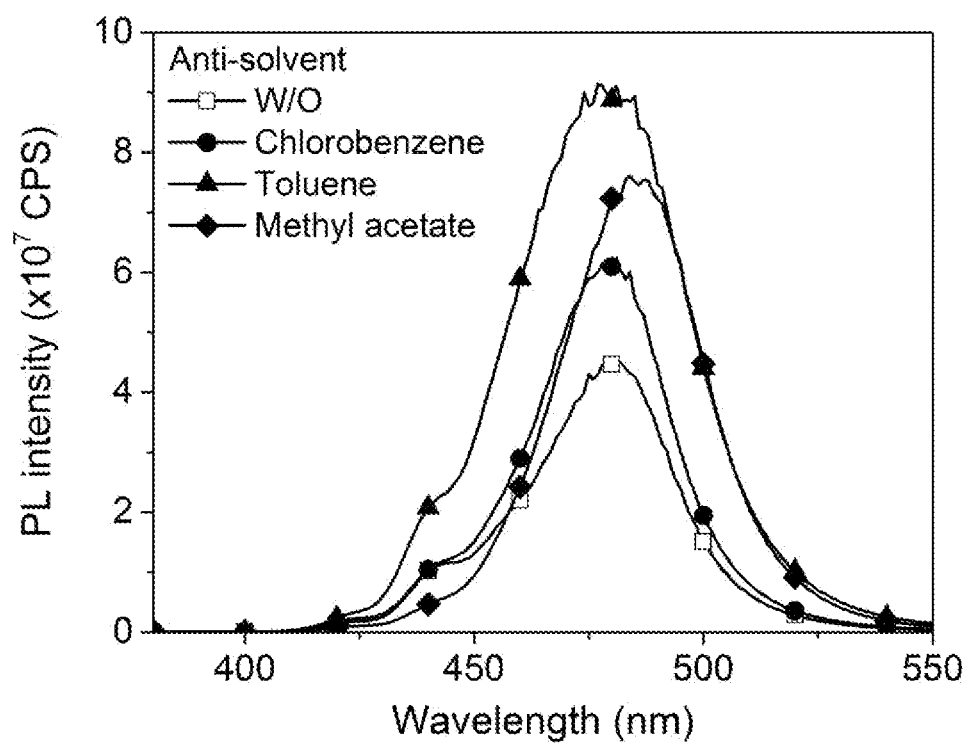
FIG. 5: Steady-state photoluminescence spectra of $((BA)_2PbBr_4)_{0.1}(Cs_{0.6}Rb_{0.4}Pb(Br_{0.5}Cl_{0.5})_3)_{0.9}$ thin films fabricated with different anti-solvent for solvent quenching method.

Table 5 summarises photoluminescence properties of $((BA)_2PbBr_4)_{0.1}(Cs_{0.6}Rb_{0.4}Pb(Br_{0.5}Cl_{0.5})_3)_{0.9}$ thin films fabricated with the anti-solvent quenching method, and provides the data for each different solvent. The accompanying data emission spectra are shown in FIG. 5. It can be seen that even with a different fabrication method, good PLQY is observed and the species emits in the blue.

TABLE 5

| Anti-solvent | PL peak position (nm) | FWHM (nm) | PLQY (%) |
|---|---|---|---|
| Without | 480 | 35.0 | 7.03 ± 0.67 |
| Chlorobenzene | 480 | 34.2 | 4.03 ± 1.00 |
| Toluene | 478 | 46.0 | 14.3 ± 2.29 |
| Methyl acetate | 485 | 36.0 | 14.6 ± 1.33 |

Table 6 summarises the photoluminescence properties on the $Cs_{1-x}Rb_xPbBr_3$ thin films for comparative purposes. The absorption and emission spectra of these species are shown in FIG. 6. It is clear that these species emit at wavelengths well above 500 nm, i.e. in the green region of the visible spectrum.

TABLE 6

| $Cs_{1-x}Rb_xPbBr_3$ X = | PL peak position (nm) | FWHM (nm) | PLQY (%) |
|---|---|---|---|
| 0 | 526 | 19.3 | 6.24 ± 0.56 |
| 0.05 | 527 | 19.9 | 11.6 ± 0.69 |
| 0.1 | 527 | 22.4 | 11.0 ± 2.47 |
| 0.2 | 526 | 19.9 | 11.7 ± 0.75 |
| 0.3 | 525 | 19.3 | 9.68 ± 2.21 |
| 0.5 | 520 | 17.1 | 4.79 ± 0.18 |
| 0.7 | 523 | 18.1 | 5.07 ± 1.67 |

Table 7 summarises the photoluminescence properties on the $(CsPbBr_3)_{1-x}((BA)_2PbBr_4)_x$ thin films for comparative purposes. The absorbance and emission spectra of these species are shown in FIG. 7. These species evidently emit in the green region of the visible spectrum; although the peak is shifted towards the blue, it does not ever fall below 500 nm.

TABLE 7

| $(CsPbBr_3)_{1-x}((BA)_2PbBr_4)_x$ X = | PL peak position (nm) | FWHM (nm) | PLQY (%) |
|---|---|---|---|
| 0 | 523 | 22.3 | 6.24 ± 0.56 |
| 0.05 | 528 | 20.6 | 13.4 ± 1.38 |
| 0.1 | 526 | 26.6 | 7.19 ± 0.69 |
| 0.3 | 524 | 24.8 | 0.94 ± 0.07 |
| 0.5 | 519 | 34.8 | 3.11 ± 0.89 |

For comparison the steady-state photoluminescence spectra of various thin films of $Cs_{1-x}Rb_xPb(I_{0.45}Br_{0.55})_3$ species are shown in FIG. 8. It can be clearly seen that these species emit far above 500 nm, in fact in the red region of the visible spectrum. Moreover, adding rubidium in low quantities in fact shifts the emission peak further to the red.

Figure 9:
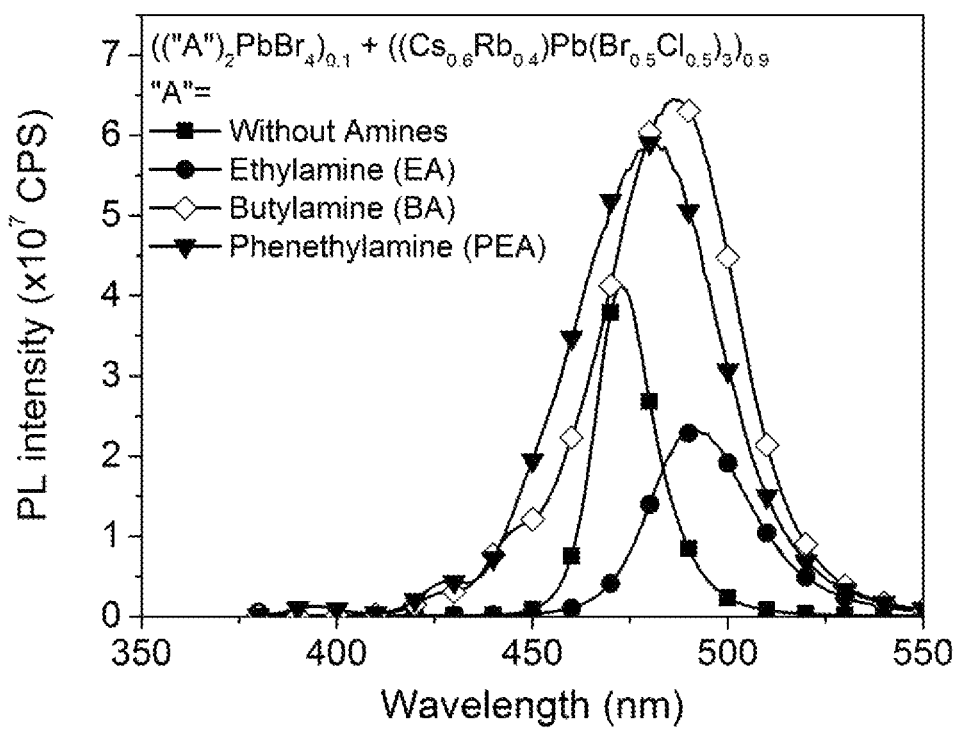
FIG. 9: Steady-state photo luminescence spectra of $(("A")_2PbBr_4)_{0.1}(Cs_{0.6}Rb_{0.4}Pb(Br_{0.5}Cl_{0.5})_3)_{0.9}$ thin films, where "A" is Ethylamine, Butylamine, and Phenethylamine.

FIG. 9 illustrates the effect of the different A cations in the $[A]_2[M][X]_4$ species on the photoluminescence characteristics of the compound of formula (II) and the mixture of the invention. In the absence of $[A]_2[M][X]_4$, considerable photoluminescent emission is observed (the peak has a large area and sits almost entirely below 500 nm). However, when an $[A]_2[M][X]_4$ species is added, particularly where the A cation is phenylethylamine or butylamine, the amount of photoluminescence greatly increases. This can be seen as the area under the peak becomes considerably greater. Thus, the emission properties of the $[A]_2[M][X]_4$-containing compounds and mixtures are greatly increased.

FIG. 10 shows the photoluminescence peak position of $(Cs_{0.6}Rb_{0.4})Pb(Br_{0.5}Cl_{0.5})_3$ under exposure to UV-light (365 nm) for periods of up to 60 min. No significant peak shift is observed for $(Cs_{0.6}Rb_{0.4})Pb(Br_{0.5}Cl_{0.5})_3$ under UV-light over the period. Moreover, although the data is not shown in FIG. 10, this compound was also exposed to UV light for periods of over 60 minutes. Again, no significant shift in the photo luminescence peak position was observed over that period. Thus, the photoluminescence spectrum of the compound of formula (I) is shown to be highly stable, and not prone to red-shift.

FIG. 11 shows the effect of increasing x above zero in a mixed perovskite of formula (II). This figure provides the steady-state photo luminescence (SSPL) spectra on the right-hand axis and the absorption spectra (left-hand axis) of $((BA)_2Pb(Br_2Cl_2)_4)_{0.33}(CsPbBr_3)_{0.67}$ and $((BA)_2Pb(Br_2Cl_2)_4)_{0.33}(Cs_{0.4}Rb_{0.6}PbBr_3)_{0.67}$ thin films. It can be clearly seen that photoluminescence peak position shifts towards higher energy (blue shift) as the Rb content increases above zero. In comparison, the mixed perovskite containing only Cs has a higher peak photoluminescence emission wavelength, indicated in the figure by the dotted arrow pointing to the right. Similarly, a clear blue shift of the band edge is observed in the absorption spectrum of $((BA)_2Pb(Br_2Cl_2)_4)_{0.33}(Cs_{0.4}Rb_{0.6}PbBr_3)_{0.67}$. This is indicated in the figure by the solid arrow pointing to the right. In addition, features between 370 and 430 nm indicate the formation of lead halide octahedral sheets of variable layer thickness (multiple "n" values in low dimensional perovskite structure).

TABLE 8

| $(CS_{1-x}Rb_xPbBr_3)_{0.77}$ $((BA)_2Pb(Br_{0.5}Cl_{0.5})_4)_{0.33}$ X = | PL peak position (nm) | FWHM (nm) | PLQY (%) |
|---|---|---|---|
| 0 | 489 | 19.0 | 2.90 ± 0.57 |
| 0.4 | 478 | 23.9 | 9.15 ± 1.06 |

The photo luminescence spectral features of FIG. 11 are summarised in Table 8. It can be clearly seen that introduction of Rb into the structure causes a large increase in PLQY, as well as a blue shift. This is very unusual.

We claim:
1. A perovskite of formula (I)

$$[Rb_xCs_{(1-x)}][Pb][Br_yCl_{(1-y)}]_3 \quad (I)$$

wherein
x is greater than 0 and less than 1,
y is greater than 0 and less than 1, and
the perovskite has a peak emission wavelength of less than 500 nm.

2. The perovskite of formula (I) according to claim 1 wherein each of x and y is independently from 0.2 to 0.8.

3. The perovskite of formula (I) according to claim 1 wherein x is from 0.35 to 0.65 and y is from 0.4 to 0.6.

4. A mixed perovskite of formula (II)

$$\{[A]_2[M][X]_4\}_a\{[Rb_bCs_{(1-b)}][Pb][Br_cCl_{(1-c)}]_3\}_{1-a} \quad (II)$$

in crystalline or powder form, wherein
[A] comprises one or more A cations which are monocations;
[M] comprises one or more M cations which are metal or metalloid dications;
[X] comprises one or more X anions which are halide anions;
a is greater than 0 and less than 1;
b is from 0 to 1;
c is from 0 to 1;
at least one of b and c is greater than 0 and less than 1; and
the mixed perovskite has a peak emission wavelength of less than 500 nm.

5. The mixed perovskite of formula (II) according to claim 4 wherein each A cation is selected from inorganic monocations and organic monocations selected from $C_{1-10}$ alkylammonium, $C_{2-10}$ alkenylammonium, alkyliminium, $C_{3-10}$ cycloalkylamammonium and $C_{3-10}$ cycloalkyliminium optionally substituted with one or more substituents selected from amine, $C_{1-6}$ alkylamino, imino, $C_{1-6}$ alkylimino, $C_{1-6}$ alkyl, $C_{2-6}$ alkenyl, $C_{3-6}$ cycloalkyl and $C_{6-12}$ aryl.

6. The mixed perovskite of formula (II) according to claim 4 wherein each A cation is selected from ethylammonium, propylammonium, butylammonium, pentylammoium, hexylammonium, septylammonium, octylammonium, benzyl ammonium, phenylethylammonium, benzylammonium, napthylmethylammonium and guanidinium.

7. The mixed perovskite of formula (II) according to claim 4 wherein each M cation is selected from $Ca^{2+}$, $Sr^{2+}$, $Cd^{2+}$, $Cu^{2+}$, $Ni^{2+}$, $Mn^{2+}$, $Fe^{2+}$, $Co^{2+}$, $Pd^{2+}$, $Ge^{2+}$, $Sn^{2+}$, $Pb^{2+}$, $Yb^{2+}$ and $Eu^{2+}$.

8. The mixed perovskite of formula (II) according to claim 4 wherein each X anion is selected from $Cl^-$, $Br^-$ and $I^-$.

9. The mixed perovskite of formula (II) according to claim 4 wherein [X] consists of a single X anion selected from $Cl^-$ or $Br^-$.

10. The mixed perovskite of formula (II) according to claim 4 wherein b and c are both greater than 0 and less than 1.

11. The mixed perovskite of formula (II) according to claim 4 wherein b is from 0.2 to 0.8.

12. The mixed perovskite of formula (II) according to claim 4 wherein c is from 0.2 to 0.8.

13. The mixed perovskite of formula (II) according to claim 4 wherein a is from 0.05 to 0.5.

14. A photoactive material comprising:
(i) a perovskite of formula (I)

$$[Rb_xCs_{(1-x)}][Pb][Br_yCl_{(1-y)}]_3 \quad (I)$$

wherein
x is greater than 0 and less than 1, y is greater than 0 and less than 1, and the perovskite has a peak emission wavelength of less than 500 nm; and/or
(ii) a mixed perovskite of formula (II)

$$\{[A]_2[M][X]_4\}_a\{[Rb_bCs_{(1-b)}][Pb][Br_cCl_{(1-c)}]_3\}_{1-a} \quad (II)$$

in crystalline or powder form, wherein
[A] comprises one or more A cations which are monocations;

[M] comprises one or more M cations which are metal or metalloid dications;

[X] comprises one or more X anions which are halide anions;

a is greater than 0 and less than 1;

b is from 0 to 1;

c is from 0 to 1;

at least one of b and c is greater than 0 and less than 1; and the mixed perovskite has a peak emission wavelength of less than 500 nm.

15. The photoactive material according to claim 14 wherein the compound of formula (I) and/or the compound of formula (II) is a crystalline compound, optionally a polycrystalline compound.

16. The photoactive material according to claim 14 further comprising a porous scaffold or a matrix material.

17. An optoelectronic device comprising the photoactive material as defined in claim 14, wherein the optoelectronic device is a light-emitting device.

18. The optoelectronic device according to claim 17 wherein the photoactive material is disposed in a layer, and optionally wherein the layer of photoactive material has a thickness of at least 2 nm.

19. An optoelectronic device according to claim 17 wherein the optoelectronic device comprises:

(a) an n-type region comprising at least one n-type layer;

(b) a p-type region comprising at least one p-type layer; and, disposed between the n-type region and the p-type region:

(c) the layer of the photoactive material.

20. A method of using the photoactive material as defined in claim 14 as a phosphor, the method comprising (i) exposing the photoactive material to light having a first wavelength, and (ii) allowing the photoactive material to re-emit light having a second wavelength, wherein the second wavelength is larger than the first wavelength.

21. The mixed perovskite of formula (II) according to claim 4 wherein each A cation is butylammonium.

22. The mixed perovskite of formula (II) according to claim 4 wherein each M cation is $Pb^{2+}$.

23. An optoelectronic device comprising the photoactive material as defined in claim 14, wherein the light-emitting device is an LED.

* * * * *